(12) United States Patent
Shimizu

(10) Patent No.: US 6,841,444 B2
(45) Date of Patent: Jan. 11, 2005

(54) NONVOLATILE SEMICONDUCTOR MEMORY DEVICE AND MANUFACTURING METHOD THEREOF

(75) Inventor: Shu Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/691,485

(22) Filed: Oct. 24, 2003

(65) Prior Publication Data

US 2004/0214394 A1 Oct. 28, 2004

(30) Foreign Application Priority Data

Apr. 24, 2003 (JP) ........................................ 2003-120086

(51) Int. Cl.$^7$ ............................................. H01L 21/336
(52) U.S. Cl. ....................... 438/257; 438/201; 438/211; 438/264; 438/265; 438/266; 438/593; 257/261; 257/298; 257/315; 257/316; 257/324; 257/326
(58) Field of Search ................................ 438/201, 211, 438/216, 241, 257, 258, 260–266, 591, 593; 257/239, 261, 298, 315–326

(56) References Cited

U.S. PATENT DOCUMENTS 6,730,959 B1 * 5/2004 Hung et al. ................. 257/316

FOREIGN PATENT DOCUMENTS

JP 2002-217319 8/2002

* cited by examiner

Primary Examiner—David Nelms
Assistant Examiner—Andy Huynh
(74) Attorney, Agent, or Firm—McDermott Will & Emery LLP

(57) ABSTRACT

A nonvolatile semiconductor memory device that can be miniaturized is provided. A method of manufacturing the nonvolatile semiconductor memory device includes the steps of: forming an interlayer insulating film covering a stacked structure and a sidewall insulating film and having a top surface approximately parallel to a main surface; forming a resist pattern as a mask layer on the top surface of the interlayer insulating film; forming a groove as an opening in the interlayer insulating film to be positioned between the sidewall insulating films formed at the adjacent stacked structures; and forming a source region extending along a plurality of floating gate electrodes by implanting impurity ions from the groove to the main surface.

7 Claims, 42 Drawing Sheets

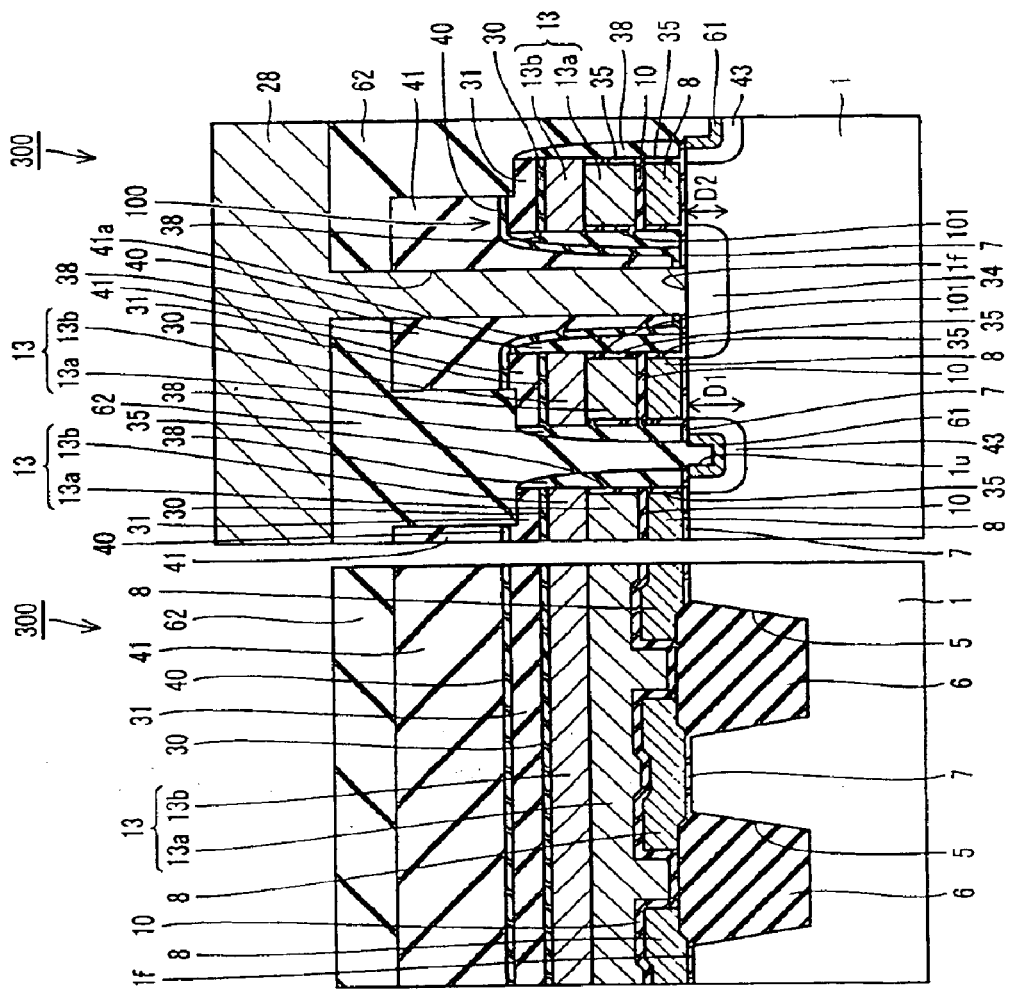

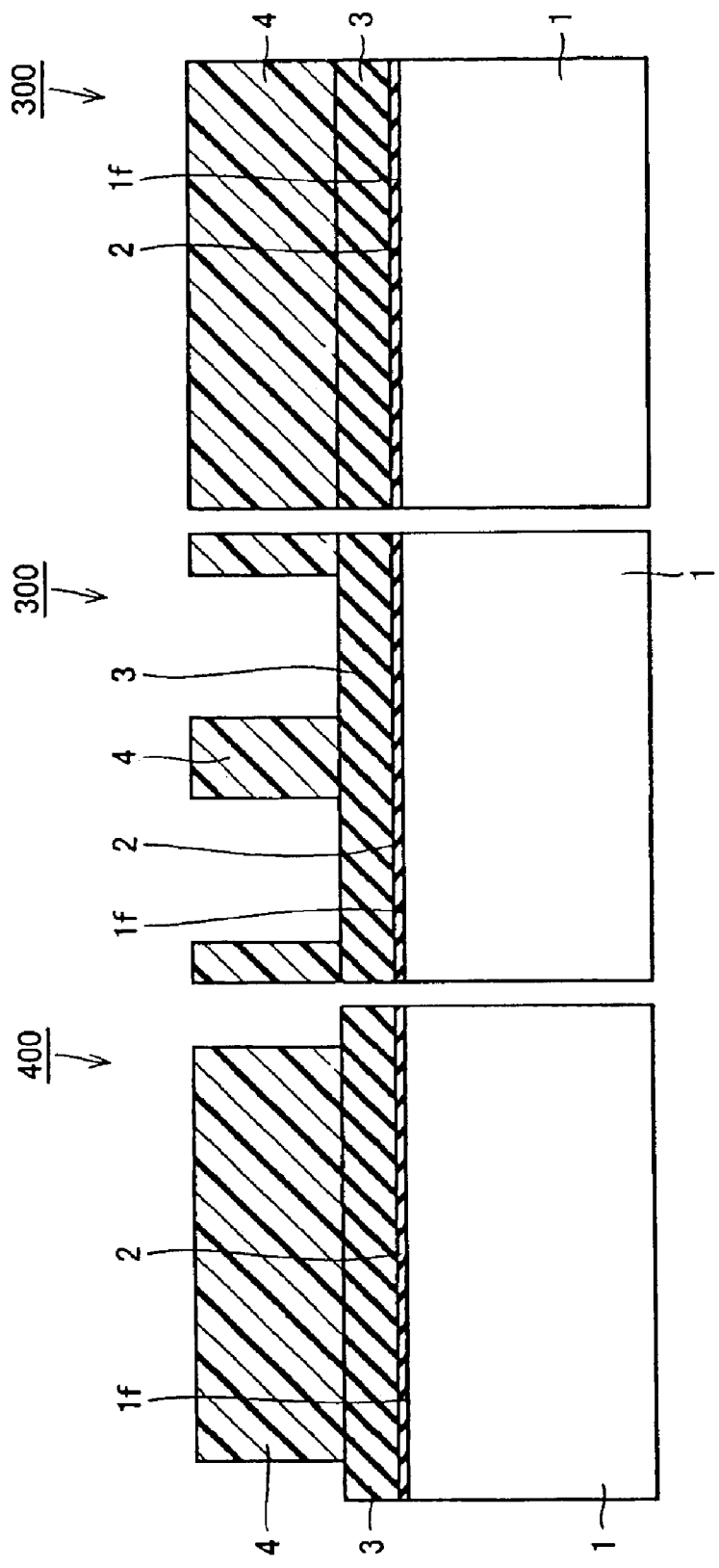

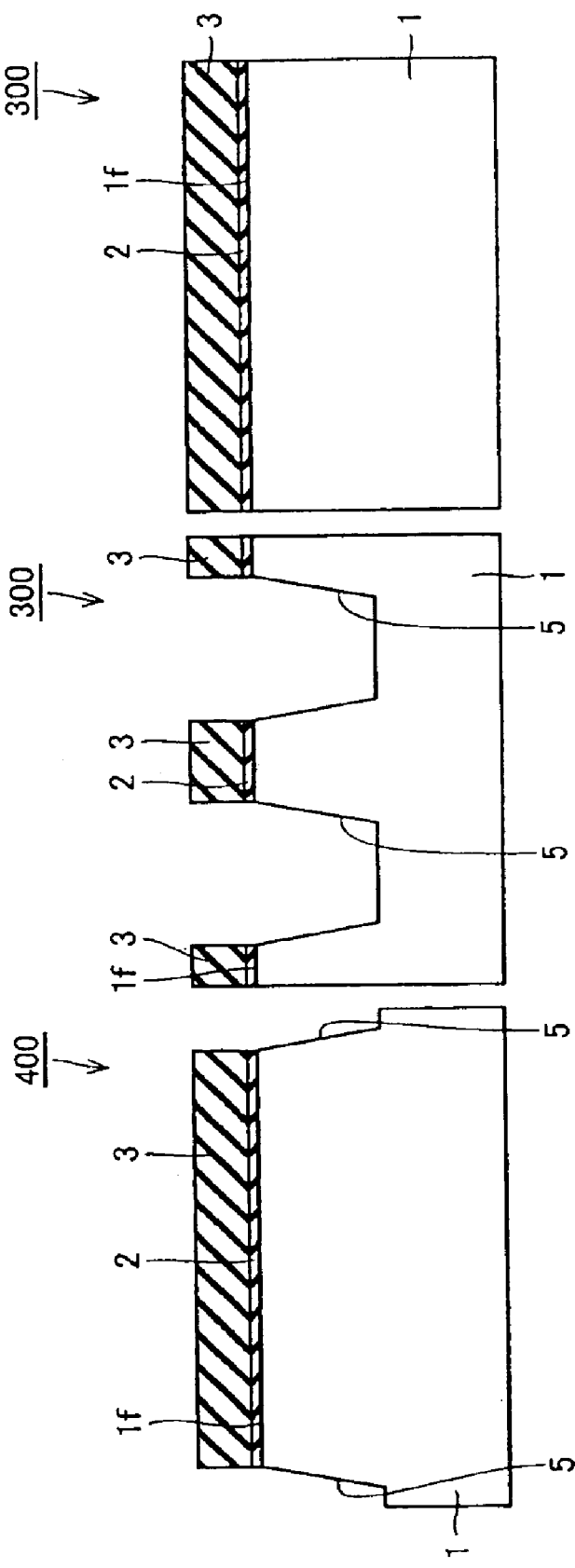

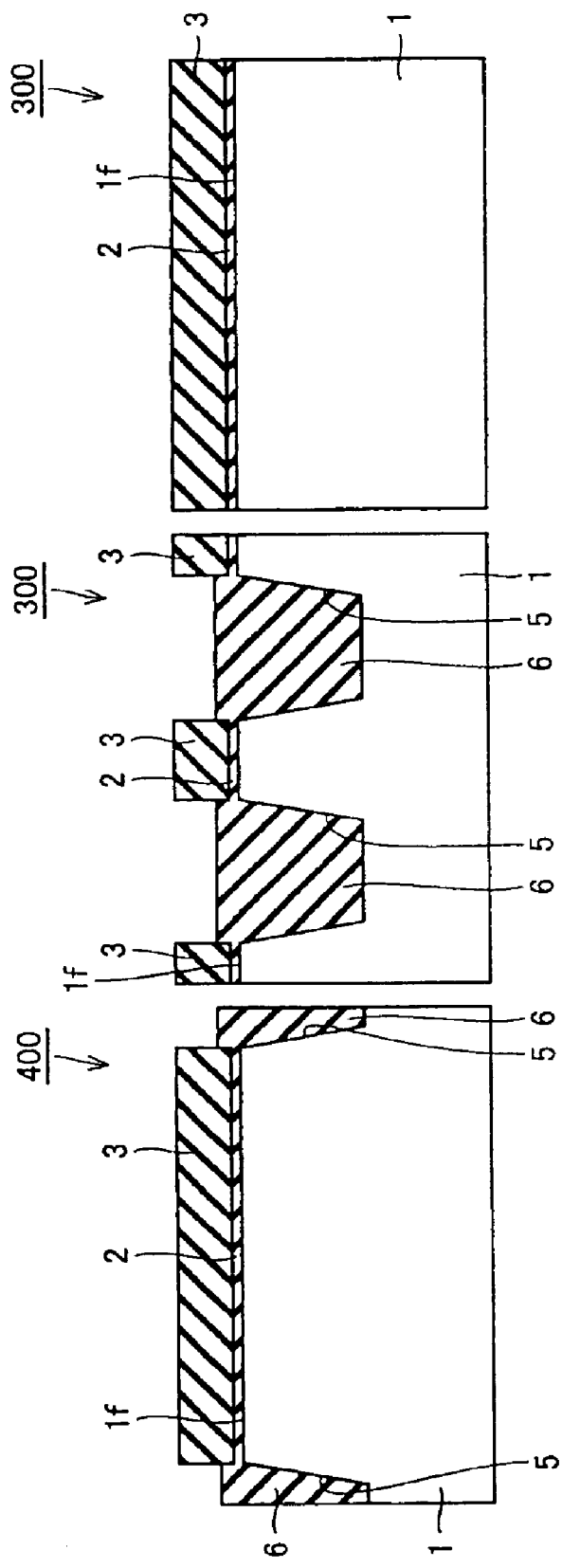

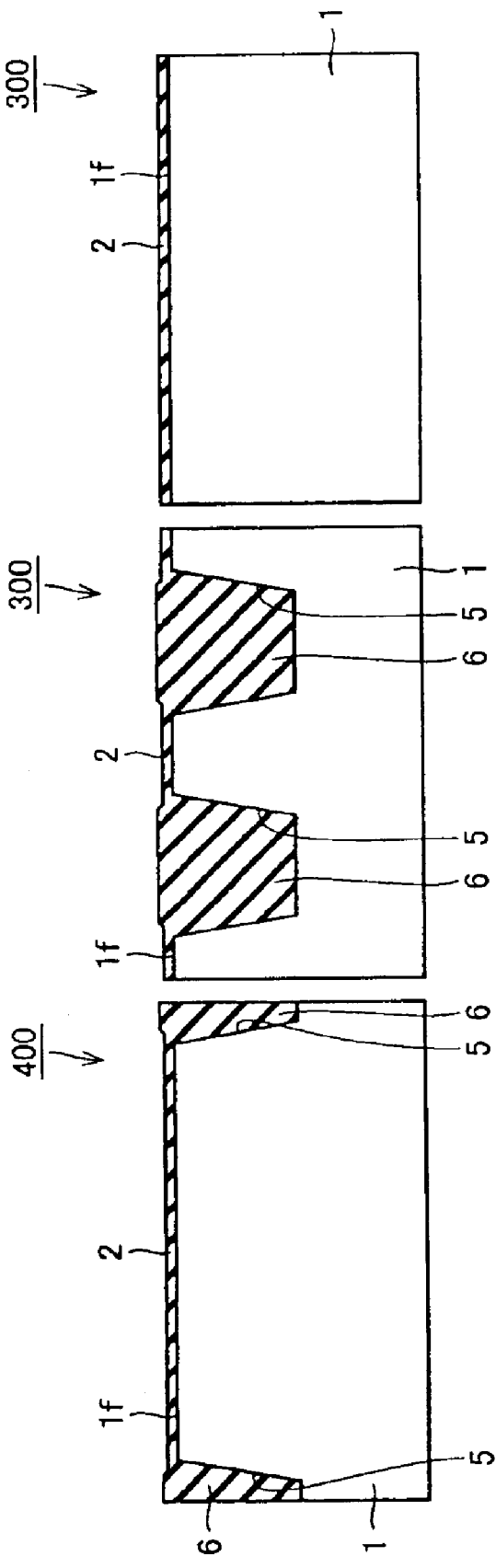

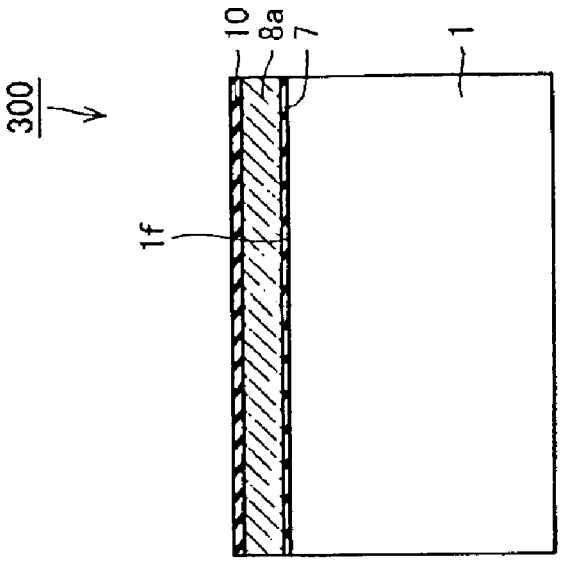

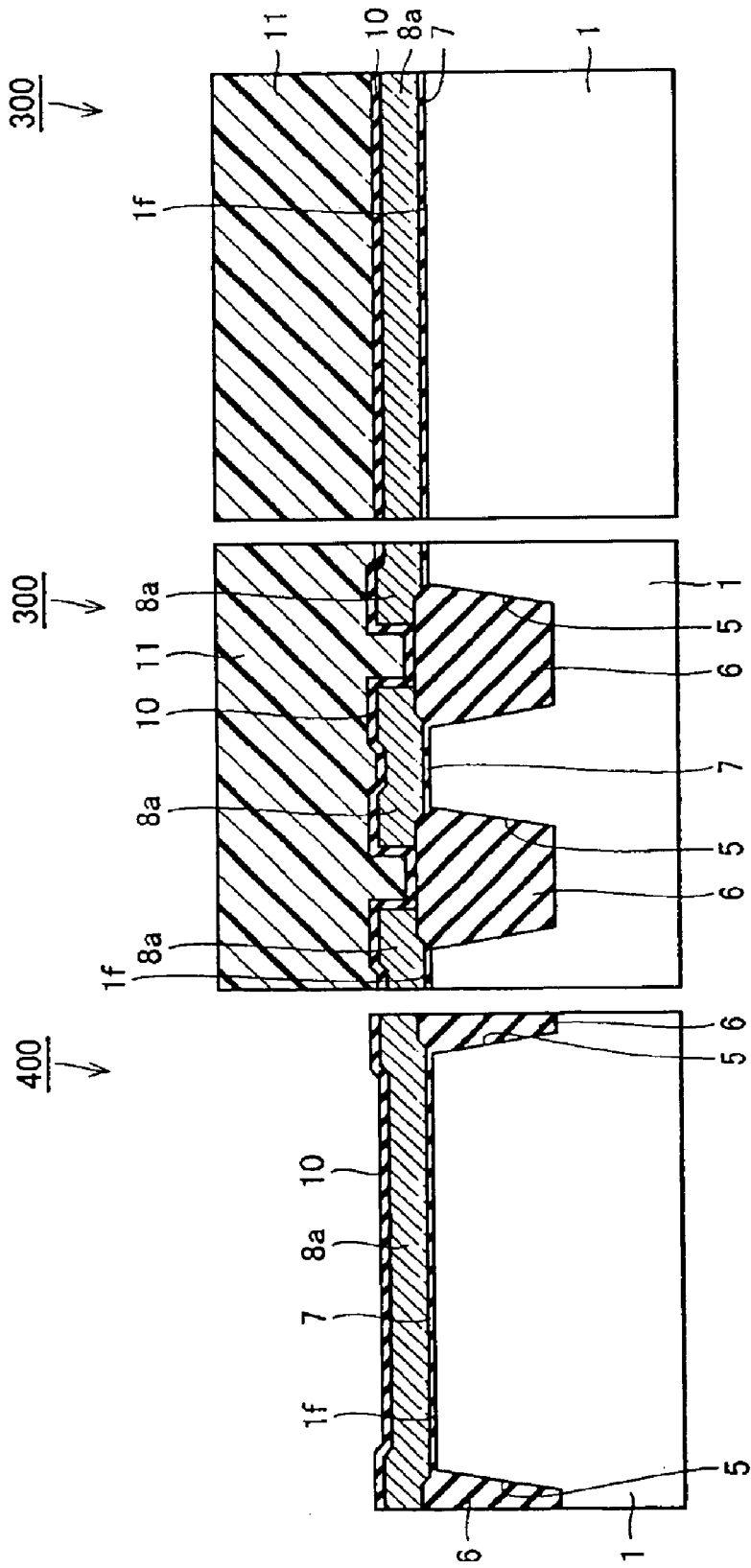

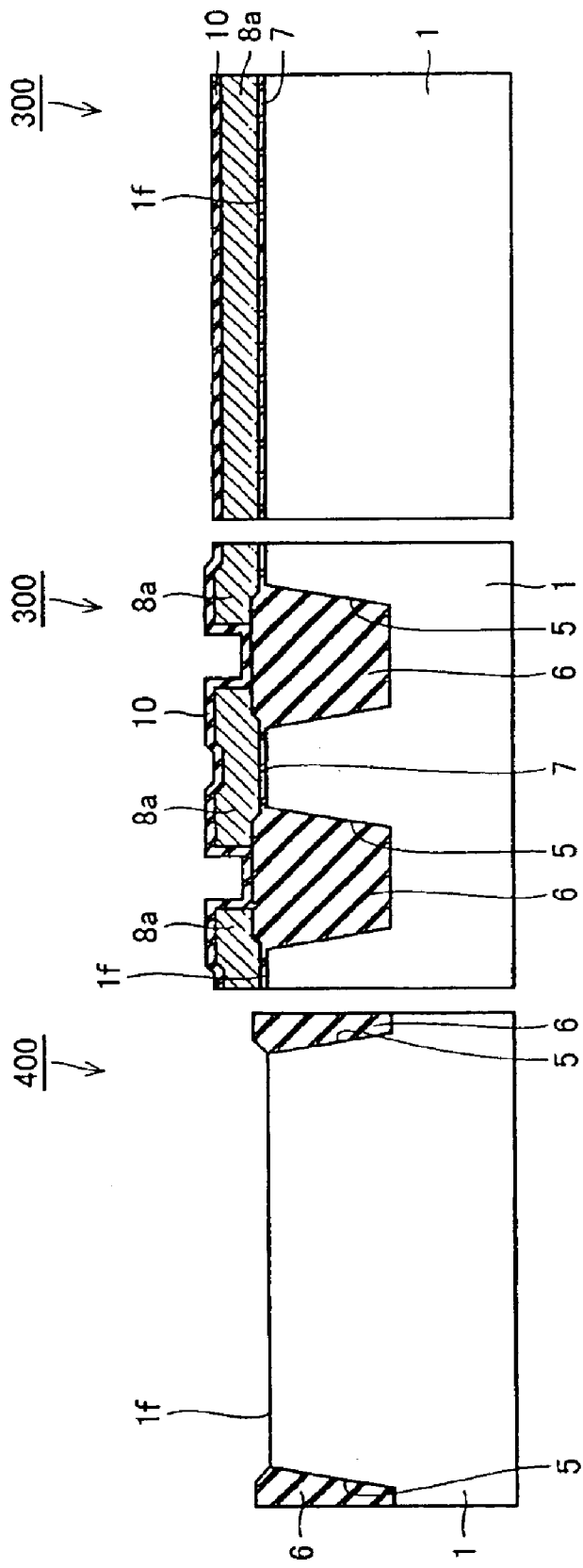

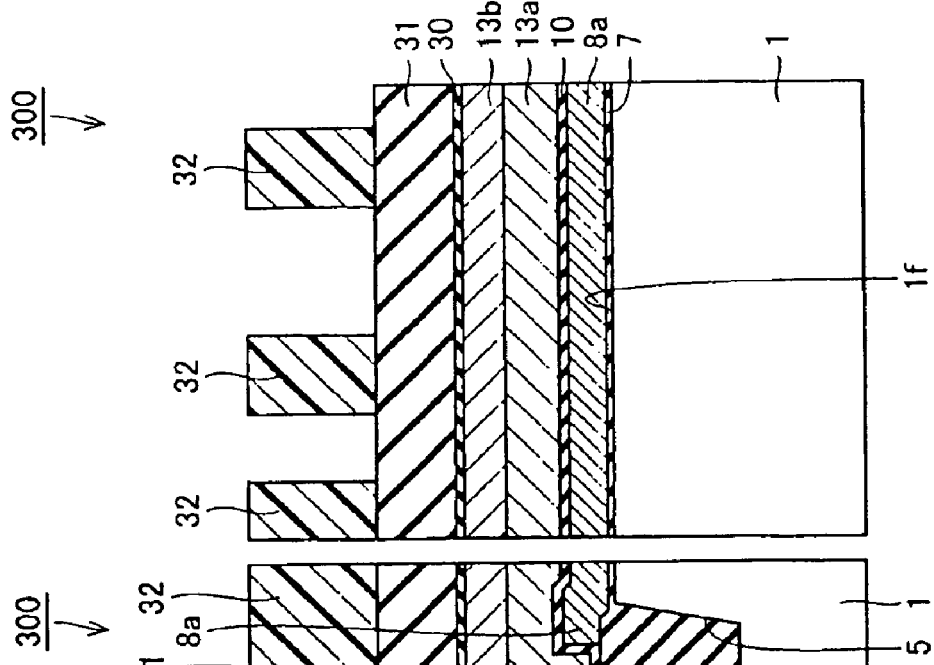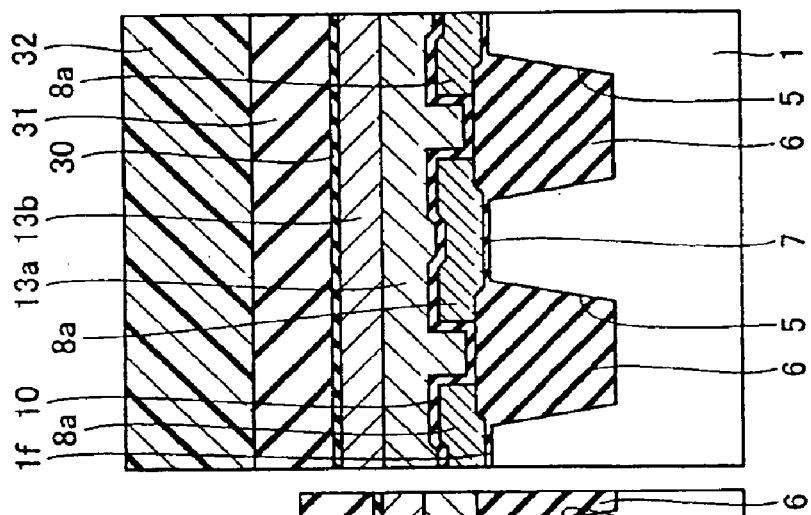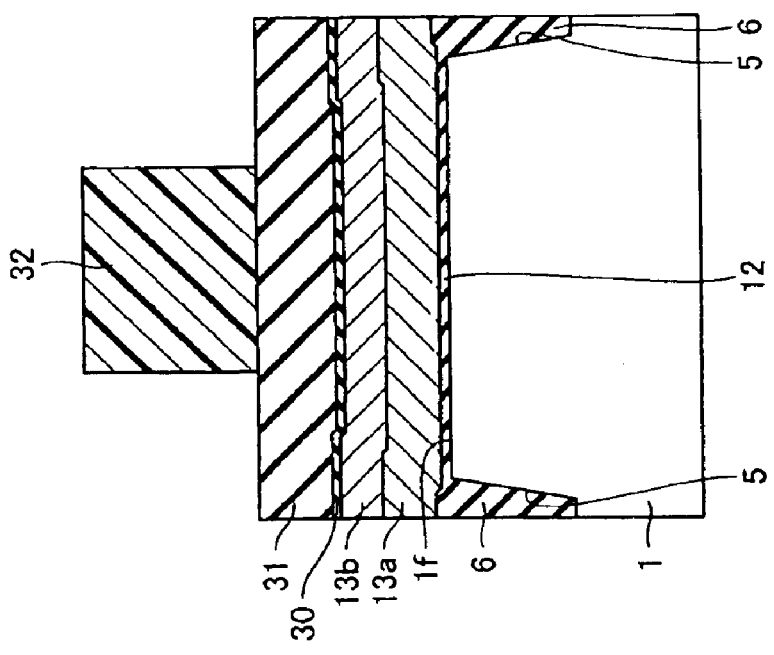

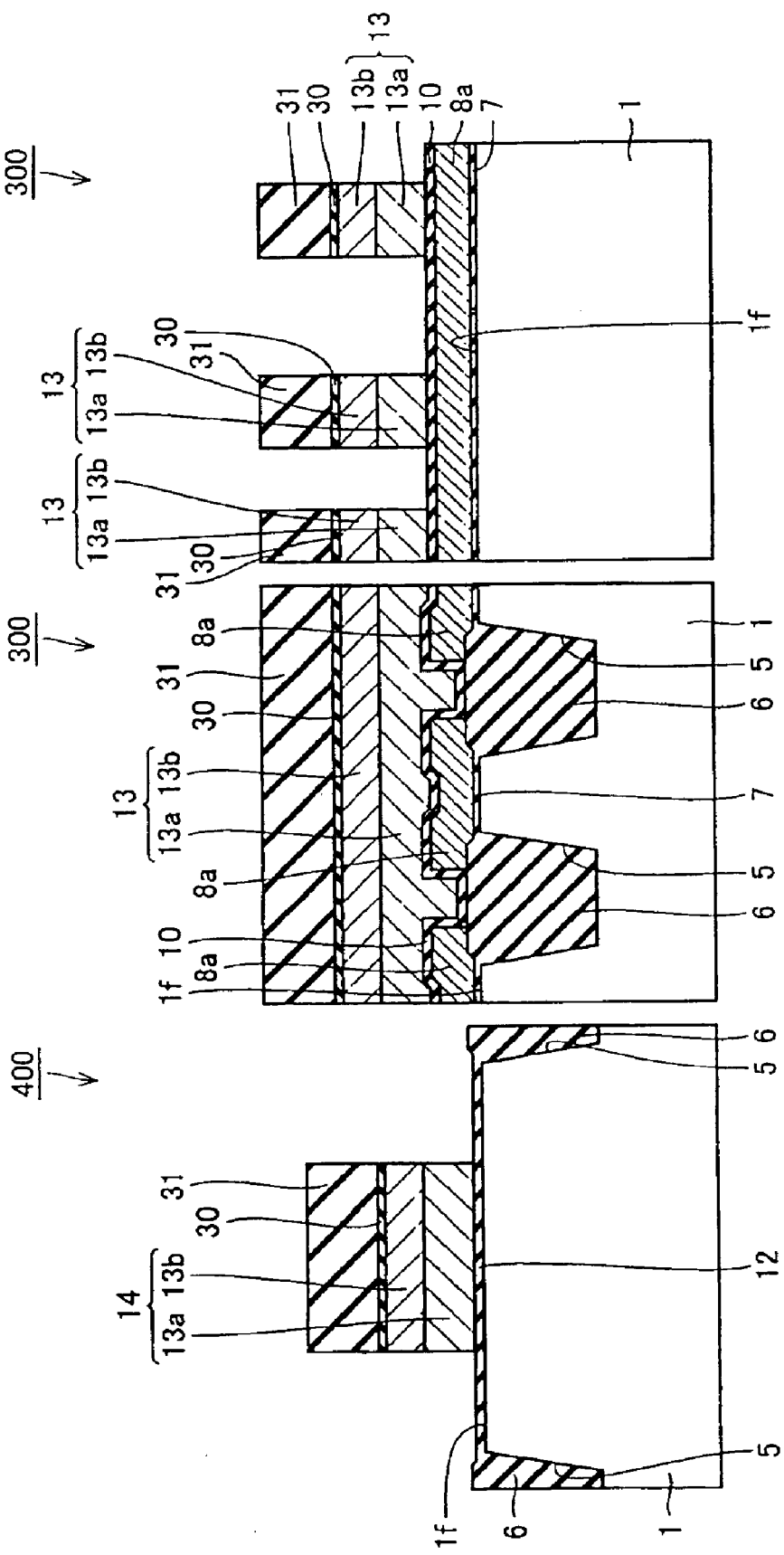

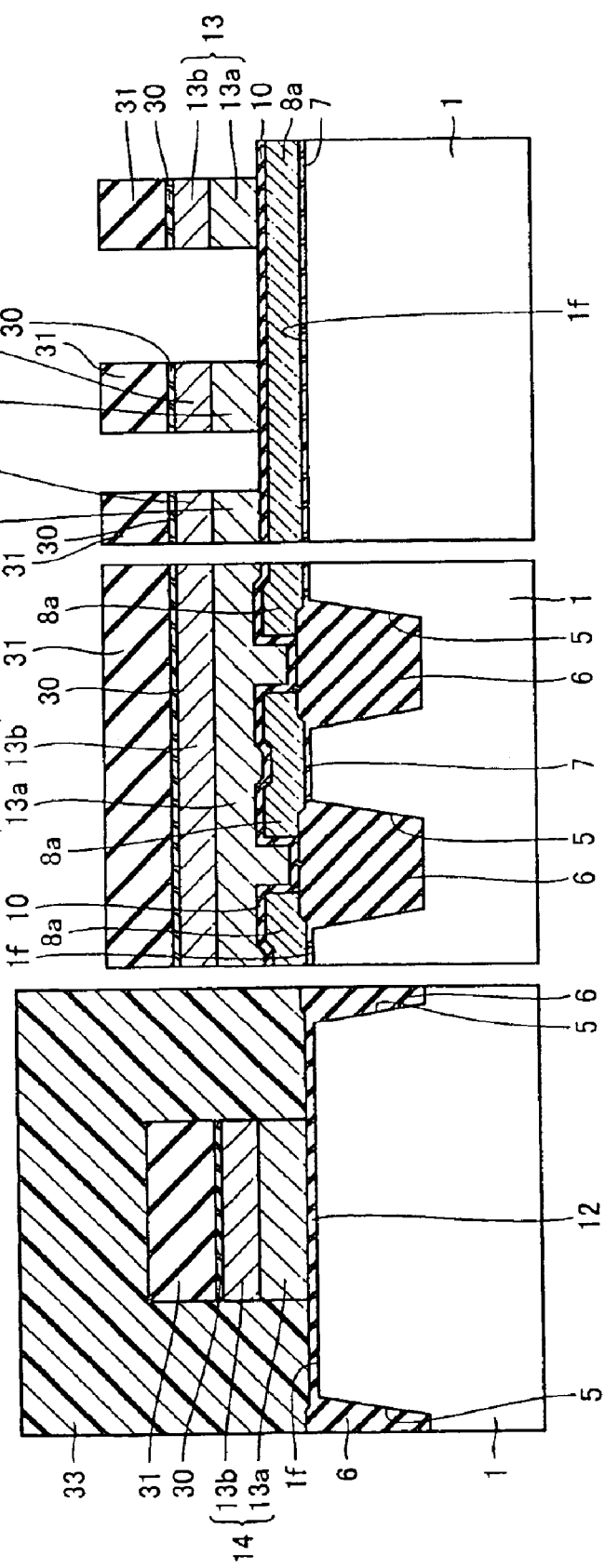

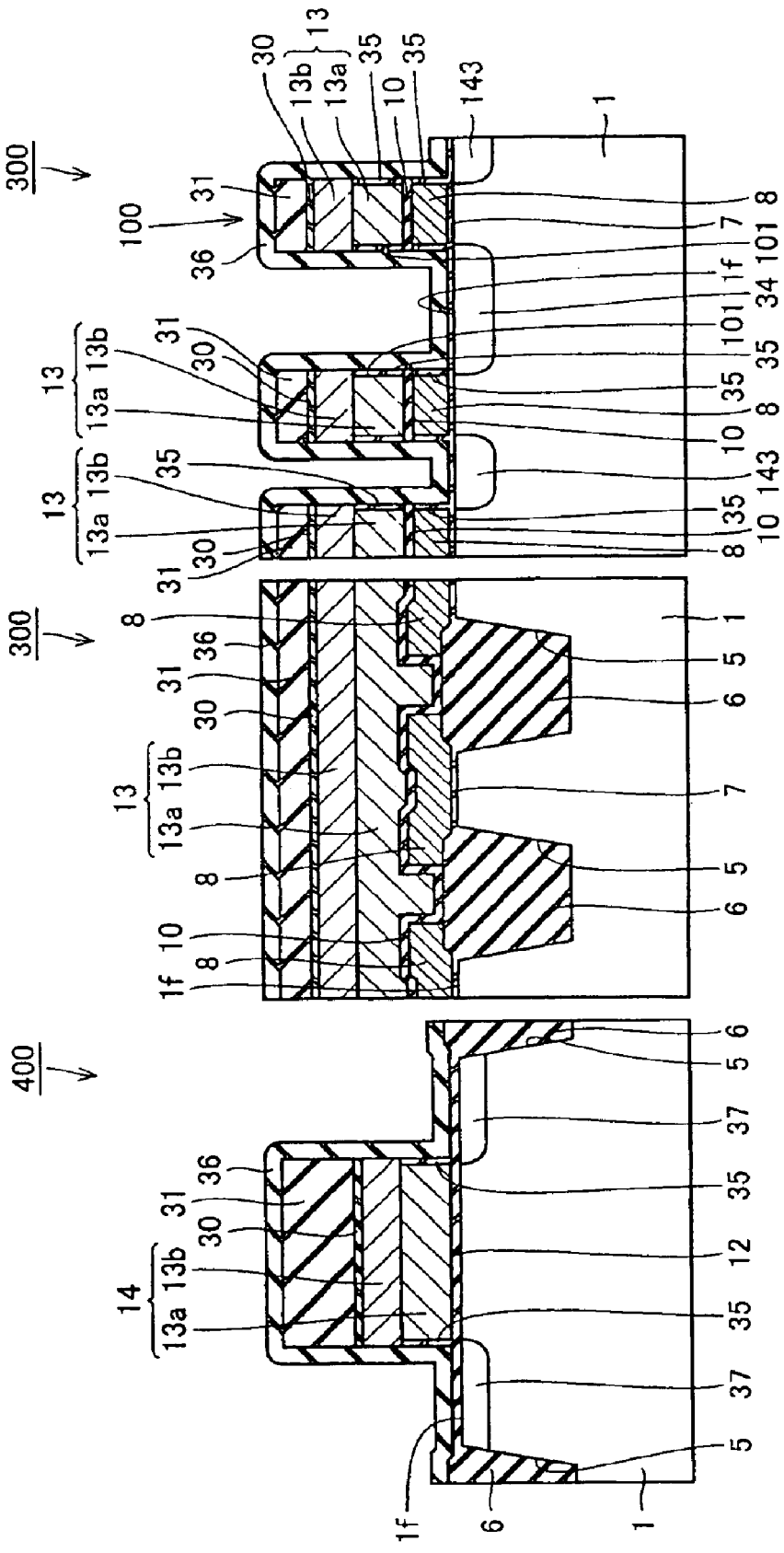

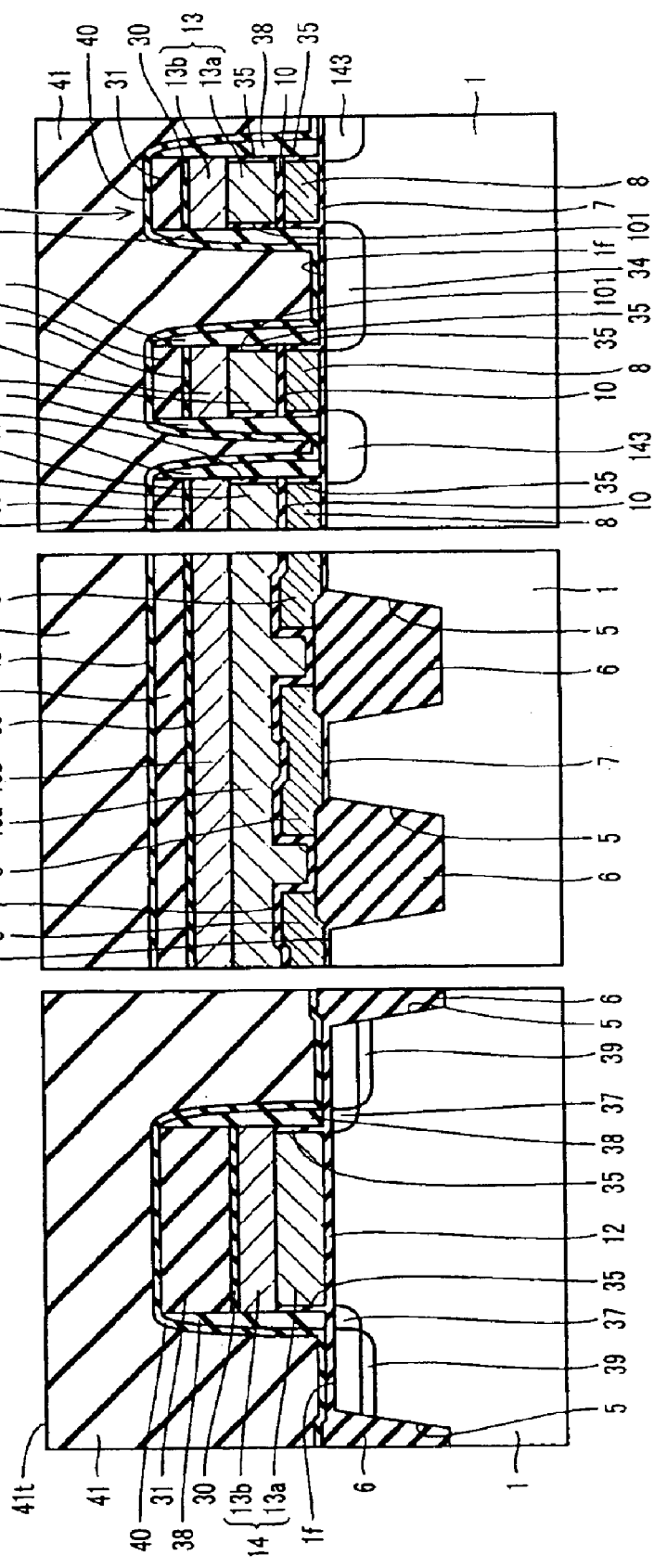

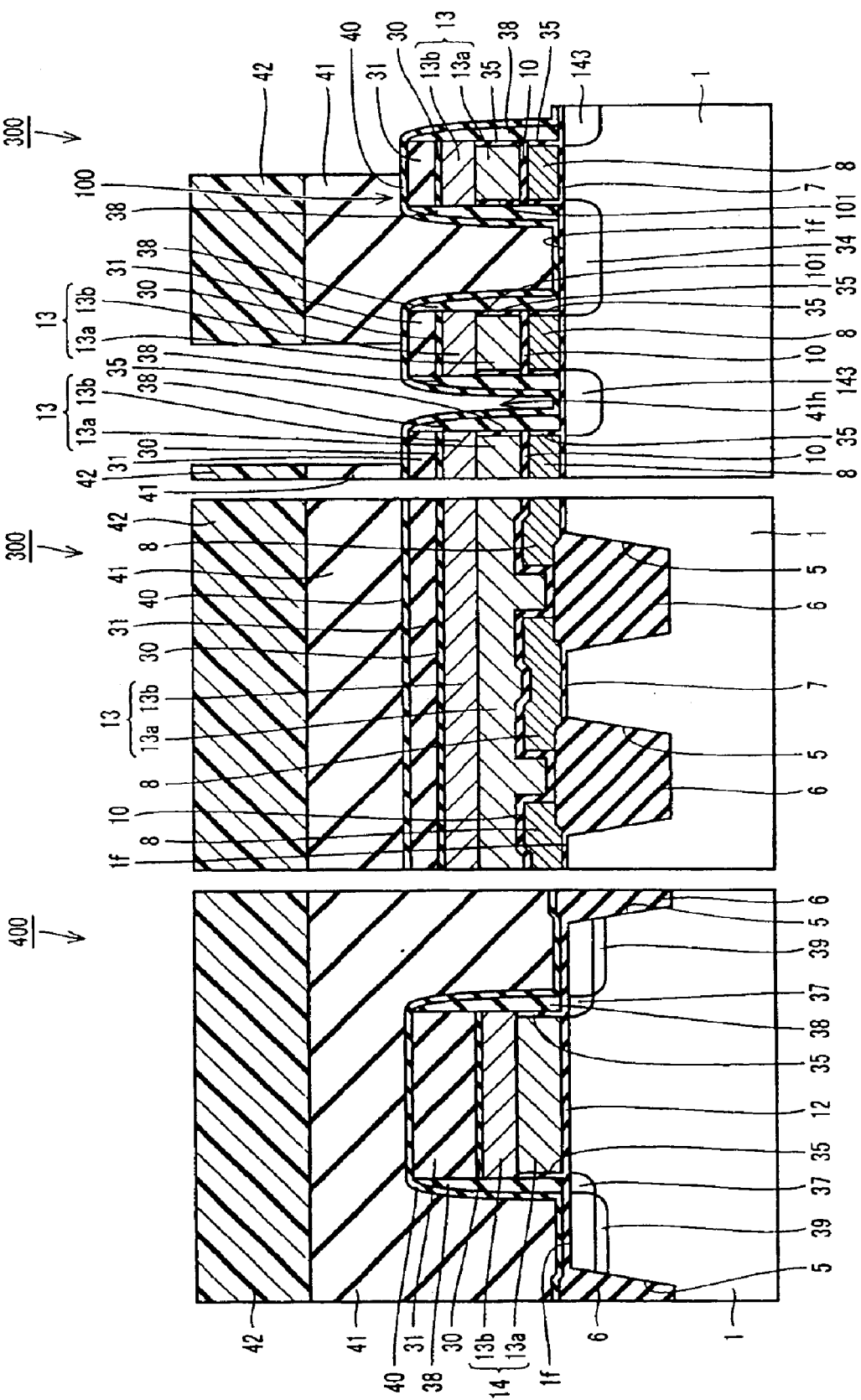

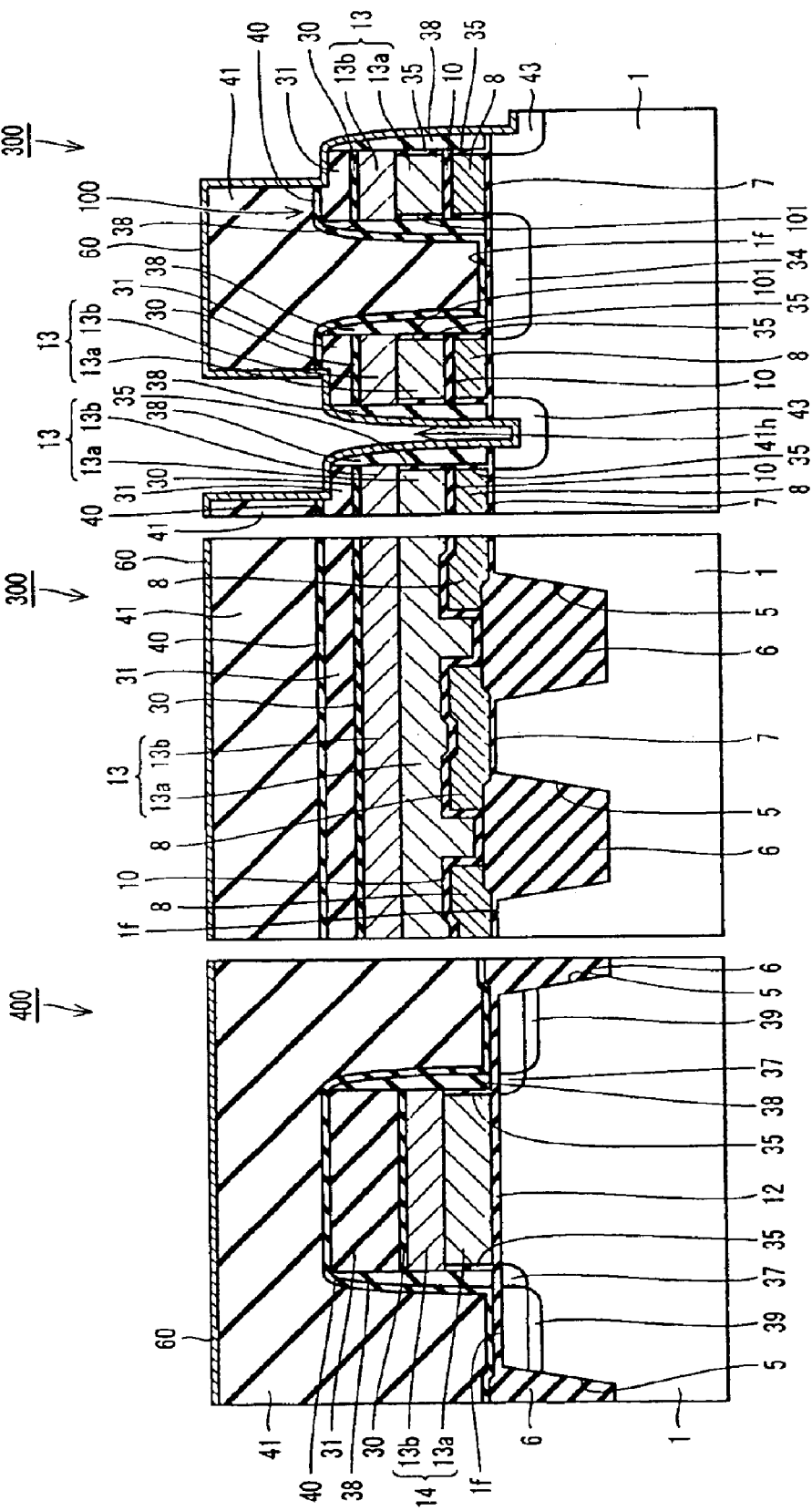

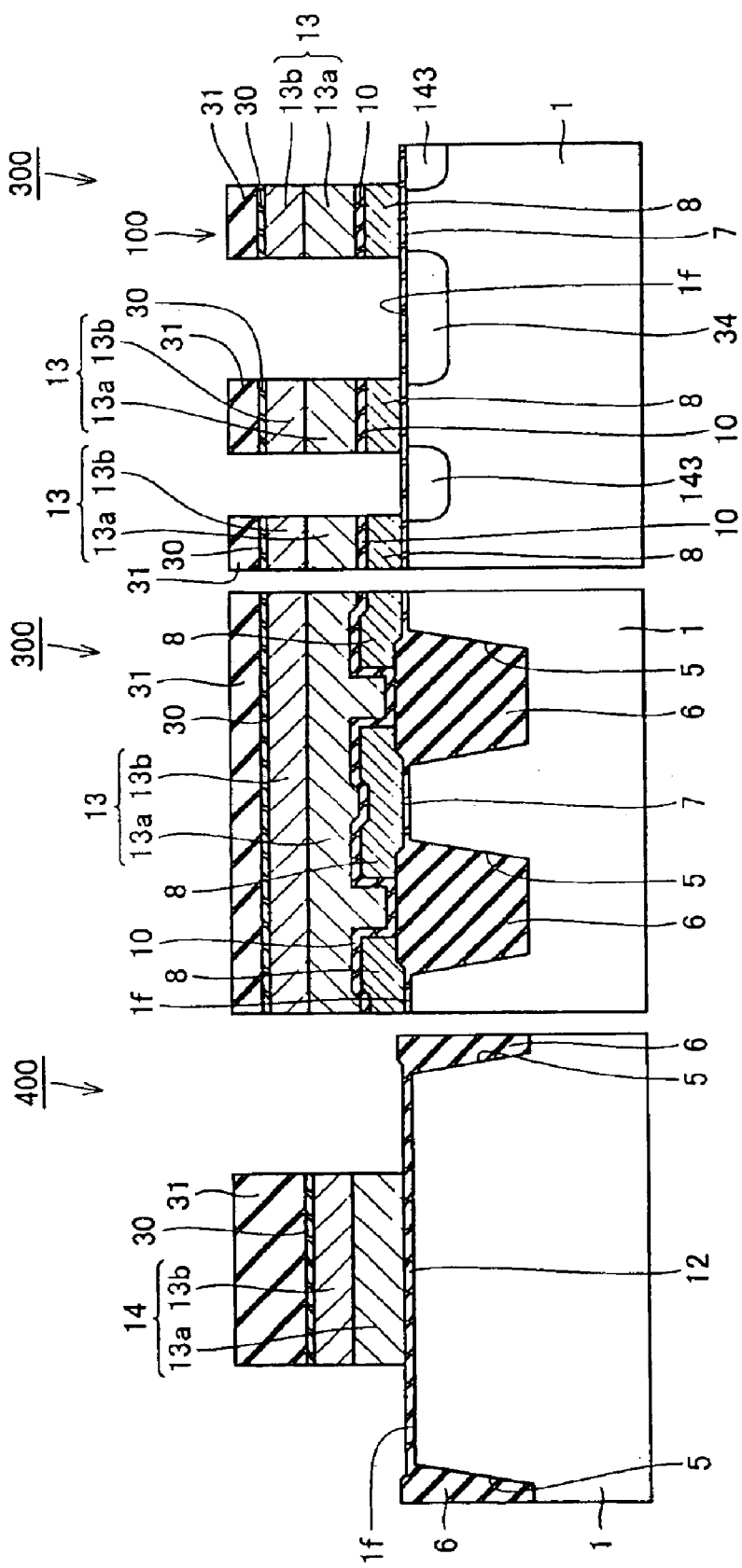

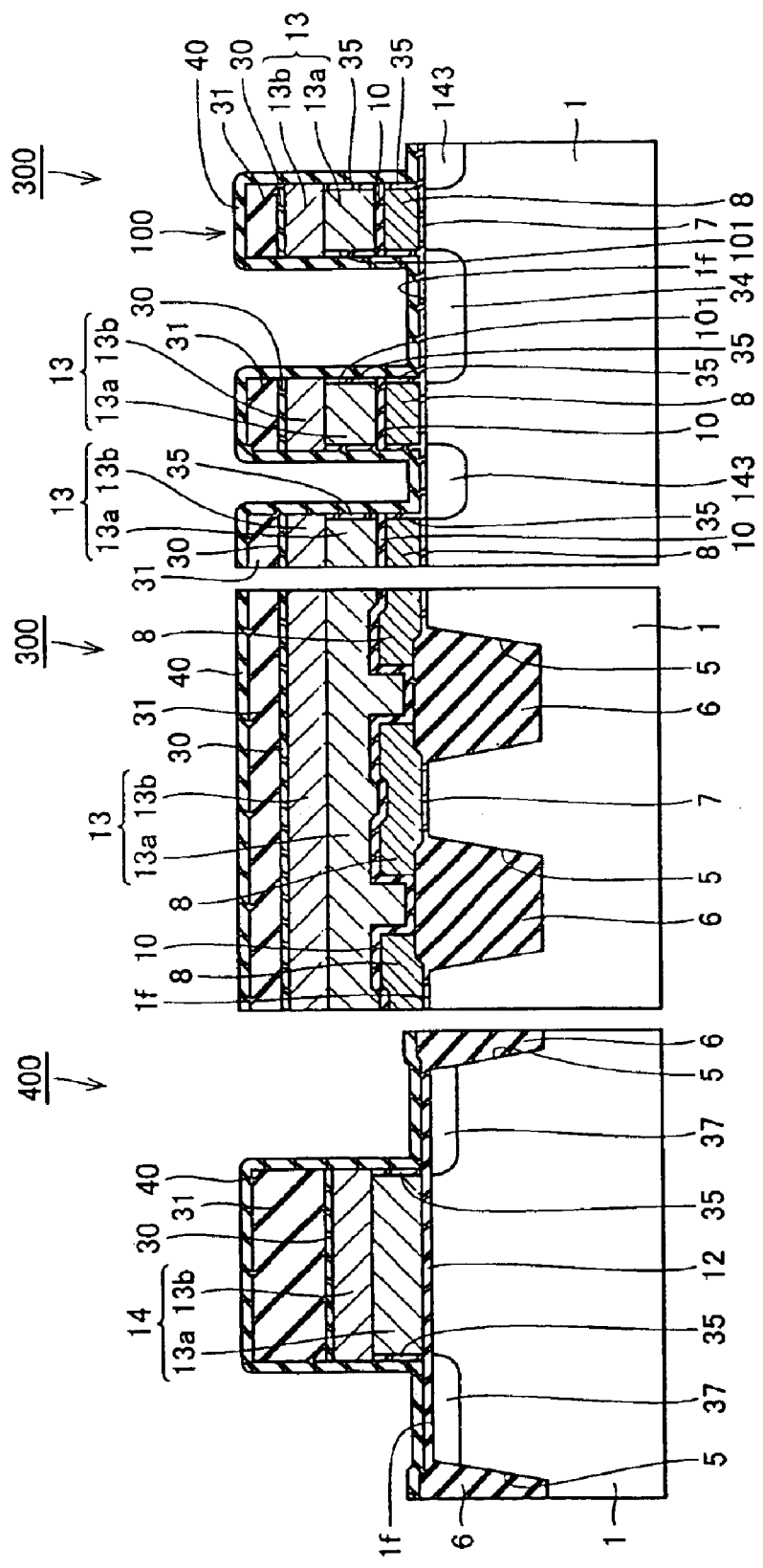

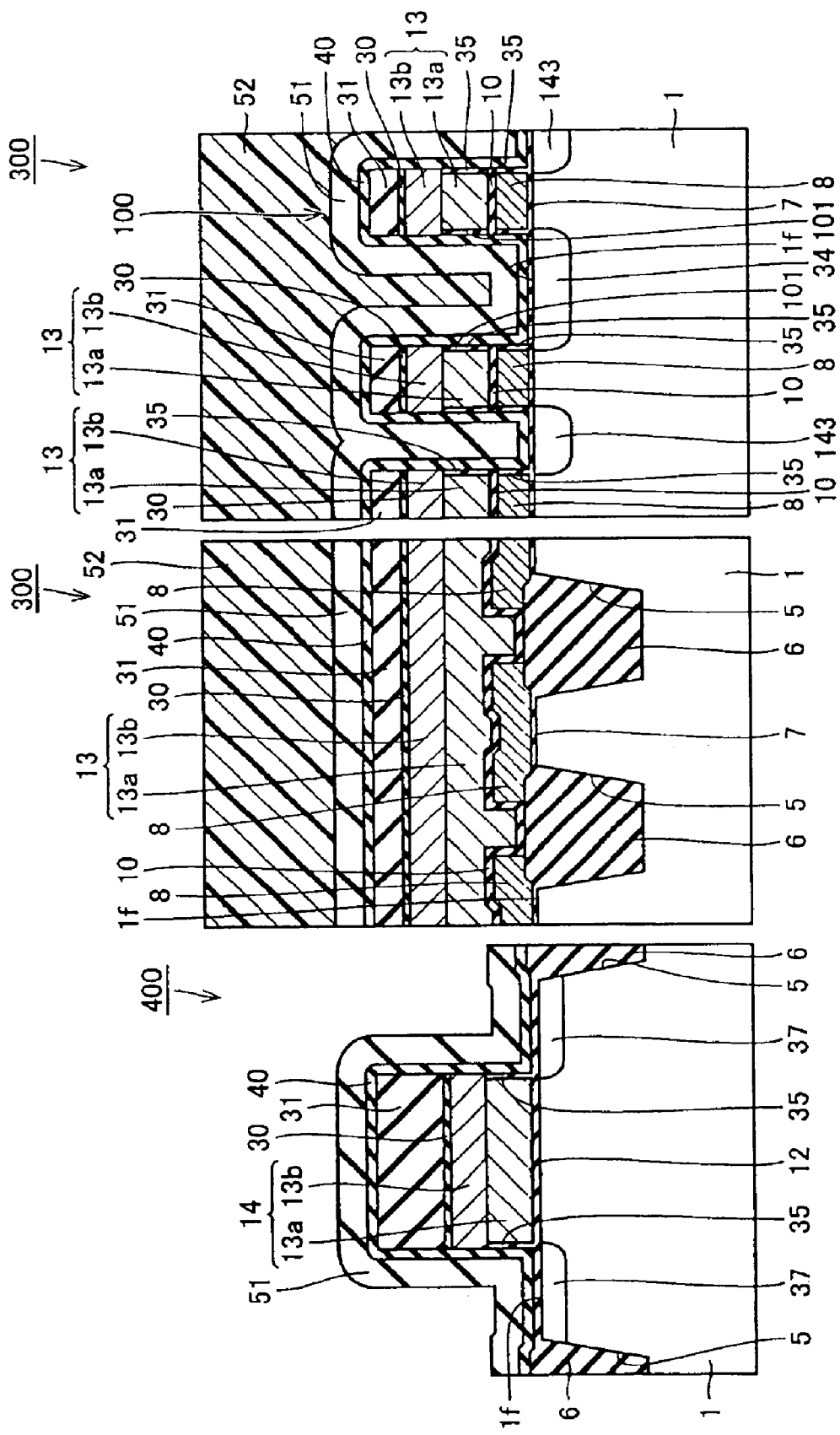

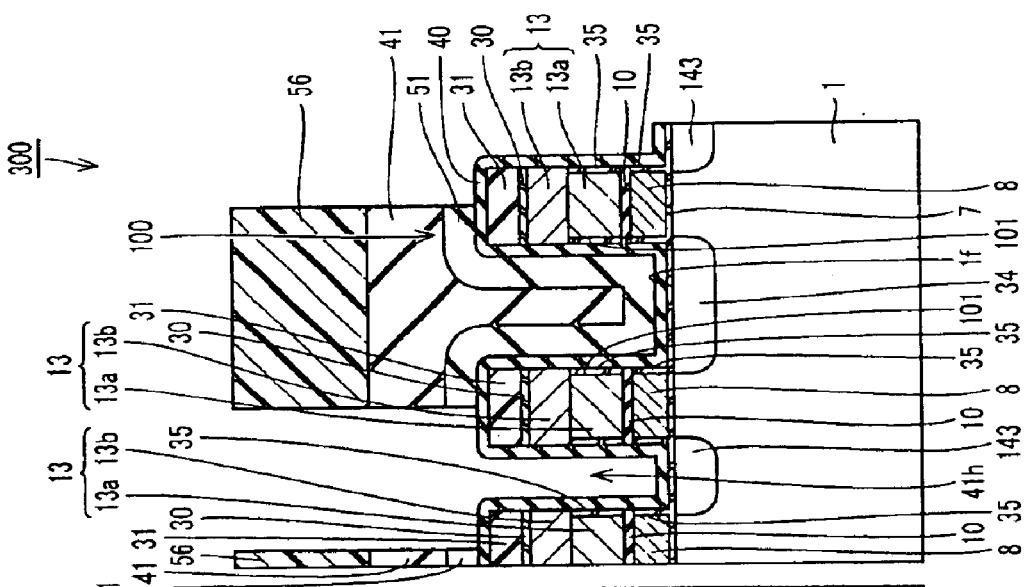
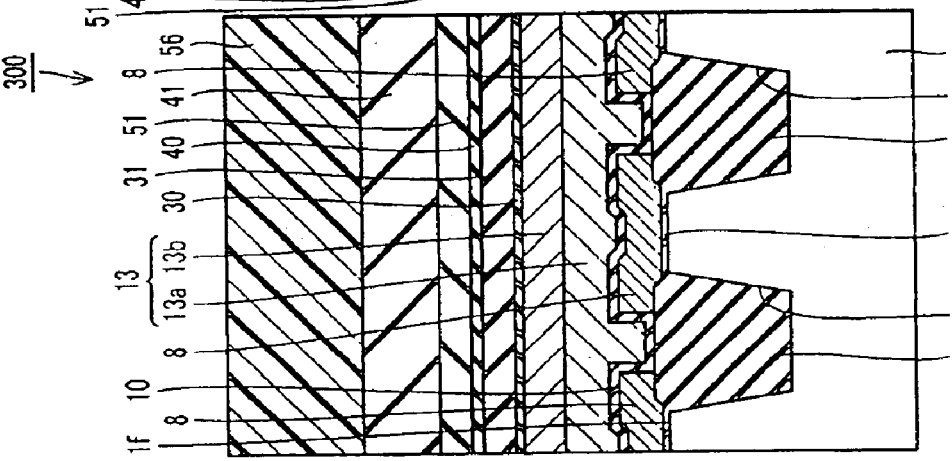
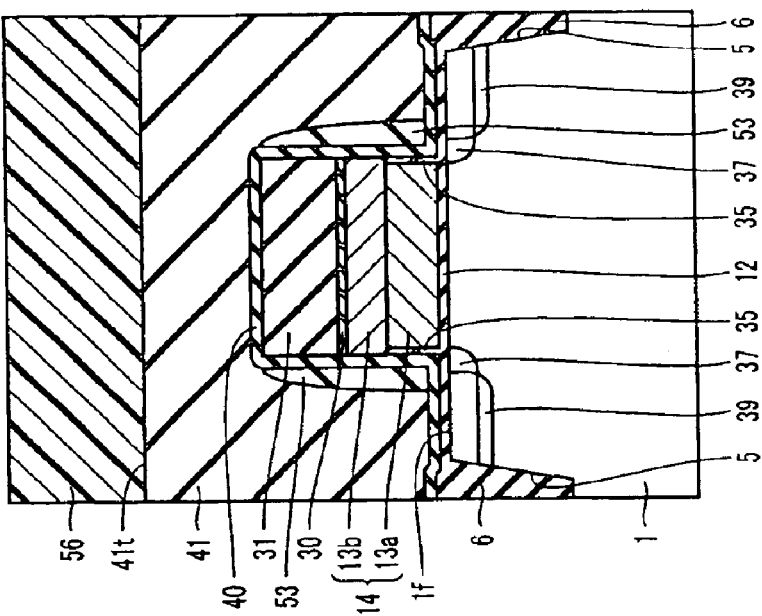

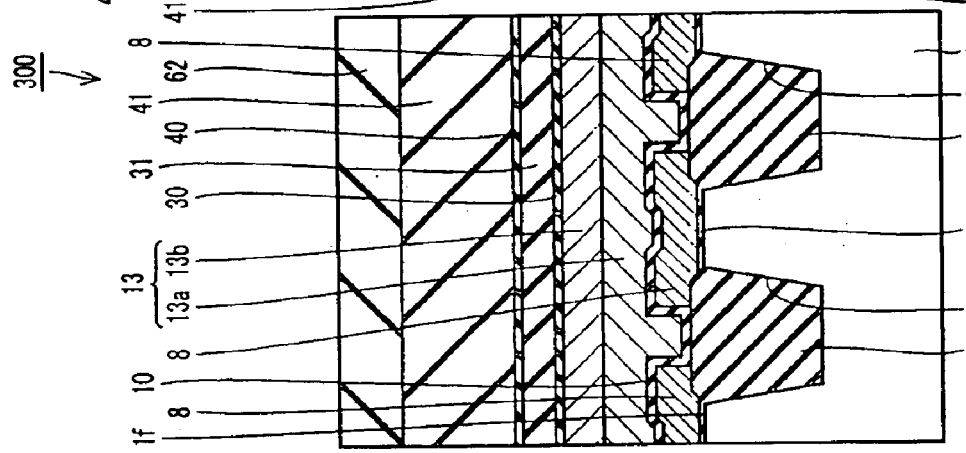
FIG.39B
FIG.39A
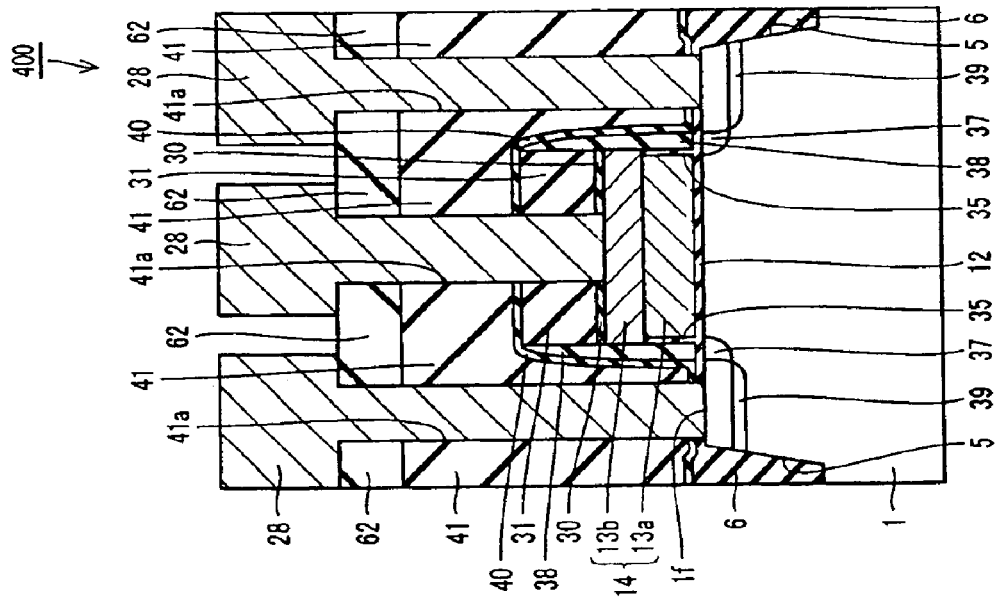
FIG.39C

US 6,841,444 B2

NONVOLATILE SEMICONDUCTOR MEMORY DEVICE AND MANUFACTURING METHOD THEREOF

BACKGROUND OF THE INVENTION

1. Field of the Invention

The present invention relates to a method of manufacturing a nonvolatile semiconductor memory device, and more particularly to a method of manufacturing a nonvolatile semiconductor memory device having a floating gate electrode.

2. Description of the Background Art

Conventionally, a nonvolatile semiconductor memory device is disclosed, for example, in Japanese Patent Laying-Open No. 2002-217319.

In the technique disclosed in the publication above, since a source and drain region is formed by implanting an impurity in a semiconductor substrate using a gate electrode as a mask, the source and drain region is short-circuited when the gate electrode is miniaturized. As a result, unfortunately, miniaturization is difficult.

SUMMARY OF THE INVENTION

The present invention is therefore made to solve the aforementioned problem and its object is to provide a method of manufacturing a nonvolatile semiconductor memory device that can be miniaturized.

In accordance with the present invention, a method of manufacturing a nonvolatile semiconductor memory device includes the steps of: forming a plurality of stacked structures on a main surface of a semiconductor substrate, each stacked structure including a side surface and having a plurality of floating gate electrodes and a control gate electrode formed on a plurality of floating gate electrodes to extend in a prescribed direction; forming an interlayer insulating film covering the stacked structure and having a top surface approximately parallel to the main surface; forming a mask layer on the top surface of the interlayer insulating film; forming an opening in the interlayer insulating film to be positioned between the stacked structures adjacent to each other by selectively etching the interlayer insulating film using the mask layer as a mask; and forming a source region extending along a plurality of floating gate electrodes by implanting impurity ions from the opening to the main surface.

In the method of manufacturing a nonvolatile semiconductor memory device including these steps, the mask layer can be formed accurately since the mask layer is formed on the flat top surface. A fine source region can be formed since the opening for forming the source region is formed according to this mask layer. As a result, it becomes possible to miniaturize the nonvolatile semiconductor memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A shows a planar view of a memory cell region and FIG. 1B shows a planar view of a peripheral circuit region.

FIGS. 2A–2C are cross sectional views of the nonvolatile semiconductor memory device in accordance with the first embodiment of the present invention, where FIG. 2A shows a cross sectional view taken along line IIA—IIA in FIG. 1B, FIG. 2B shows a cross sectional view taken along line IIB—IIB in FIG. 1A, and FIG. 2C shows a cross sectional view taken along line IIC—IIC in FIG. 1A.

FIGS. 5A–25C are cross sectional views showing first to twenty-first steps in a method of manufacturing the nonvolatile semiconductor memory device shown in FIGS. 2A–2C.

FIGS. 27A–28C are cross sectional views showing twenty-second and twenty-third steps in the method of manufacturing the nonvolatile semiconductor memory device shown in FIGS. 2A–2C.

FIG. 29A shows a cross section corresponding to FIG. 2A, FIG. 29B shows a cross section corresponding to FIG. 2B, and FIG. 29C shows a cross section corresponding to FIG. 2C.

FIGS. 30A–35C are cross sectional views showing first to sixth steps of a method of manufacturing the nonvolatile semiconductor memory device shown in FIGS. 29A–29C.

FIGS. 37A–38C are cross sectional views showing seventh and eighth steps of the method of manufacturing the nonvolatile semiconductor memory device shown in FIGS. 29A–29C.

FIGS. 39A–39C are cross sectional views corresponding to FIGS. 2A–2C, of a nonvolatile semiconductor memory device in accordance with a third embodiment of the present invention.

DESCRIPTION OF THE PREFERRED EMBODIMENTS

Figure 1A:
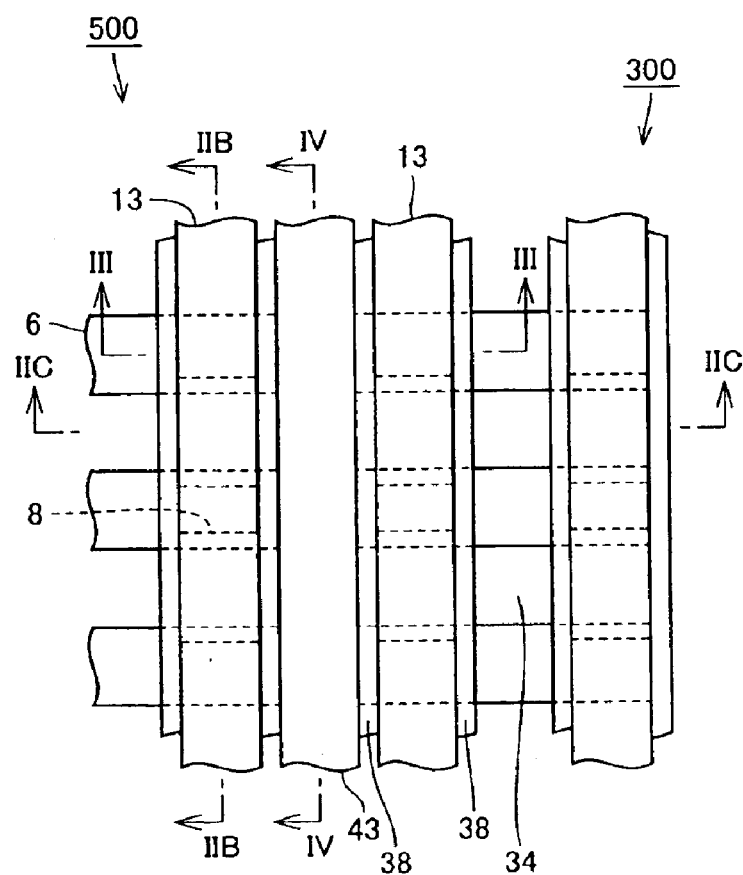
FIGS. 1A and 1B are planar views of a nonvolatile semiconductor memory device in accordance with a first embodiment of the present invention, where

In the following, embodiments of the present invention will be described with reference to the figures. It is noted that in the following embodiments, the same or corresponding parts will be denoted with the same reference characters, and description thereof will not be repeated.

First Embodiment

Figure 1B:
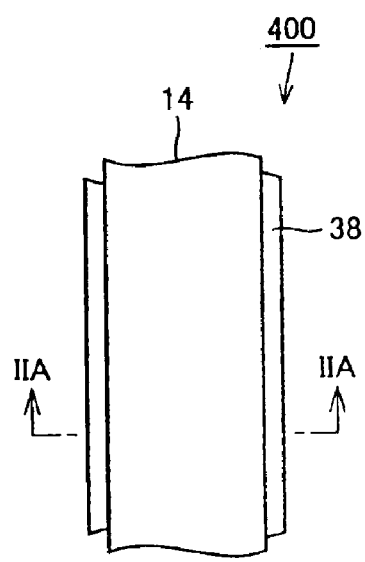

Referring to FIGS. 1A and 1B, a nonvolatile semiconductor memory device 500 in accordance with a first embodiment of the present invention includes a memory cell region 300 and a peripheral circuit region 400. In memory cell region 300, a buried oxide film 6 is formed as an isolation insulating film. A control gate electrode 13 is formed on buried oxide film 6 to extend in a prescribed direction, and a floating gate electrode 8 is formed under control gate electrode 13. A sidewall insulating film 38 is formed on the sidewalls of floating gate electrode 8 and control gate electrode 13. Between two control gate electrodes 13, a source region 43 is formed continuously in one direction. Source region 43 is formed on one side of control gate electrode 13, and an impurity region (drain region) 34 is formed on the other side thereof.

Referring to FIG. 1B, in peripheral circuit region 400, a gate electrode 14 is formed, and sidewall insulating film 38 is formed on the sidewall of gate electrode 14.

Referring to FIG. 2A, in peripheral circuit region 400, a trench 5 is formed in the surface of a silicon substrate 1. Trench 5 is filled with buried oxide film 6 made of a silicon oxide film. In a main surface 1f of silicon substrate 1, a lightly-doped impurity region 37 and a heavily-doped impurity region 39 having an impurity concentration higher than impurity region 37 are formed. Impurity regions 37 and 39 include an n-type impurity or a p-type impurity.

A thermal oxide film 12 is formed as a gate insulating film on main surface 1f of silicon substrate 1. On thermal oxide film 12, gate electrode 14, which is formed of a doped polysilicon layer 13a and a tungsten silicide layer 13b, is provided with a silicon oxide film 35.

On gate electrode 14, a silicon oxide film 30 and a silicon nitride film 31 are formed. Sidewall insulating film 38 is formed in contact with silicon oxide film 30 and silicon nitride film 31. A thin film-like silicon nitride film 40 is formed to cover silicon nitride film 31 and sidewall insulating film 38.

An interlayer insulating film 41 is formed to cover gate electrode 14. A silicon oxide film 62 is formed on interlayer insulating film. A contact hole 41a reaching main surface 1f is formed in silicon oxide film 62 and interlayer insulating film 41. A plurality of contact holes 41a are formed each being filled with an interconnection layer 28 made of doped polysilicon.

Referring to FIG. 2B, a plurality of trenches 5 are formed spaced apart from each other in silicon substrate 1, in the gate width direction of the gate electrode. Buried oxide film 6 is formed to fill trench 5. Thermal oxide film 7 is formed as a tunnel oxide film to cover main surface 1f. A floating gate electrode 8 made of doped polysilicon is formed on thermal oxide film 7 and buried oxide film 6. A plurality of floating gate electrodes 8 are formed like islands. An ONO film 10 of three-layer structure of a silicon oxide film, a silicon nitride film and a silicon oxide film is formed to cover floating gate electrode 8.

A control gate electrode 13 is formed on ONO film 10. Control gate electrode 13 is formed of the same material as doped polysilicon layer 13a and tungsten silicide layer 13b shown in FIG. 2A. Silicon oxide film 30, silicon nitride film 31 and silicon nitride film 40 are stacked to cover control gate electrode 13. Interlayer insulating film 41, silicon oxide film 62 and interconnection layer 28 are formed on silicon nitride film 40.

Referring to FIG. 2C, a recessed portion 1u is formed in main surface 1f of silicon substrate 1. A source region 43 is formed at recessed portion 1u. Source region 43 includes a silicide region 61 including a refractory metal, which is formed by contacting silicon substrate 1 with a refractory metal. The depth of source region 43 is represented as D1.

A drain region formed of impurity region 34 is formed to be isolated from source region 43. The depth of the drain region (impurity region 34) is represented as D2. Depth D1 of source region 43 is larger than depth D2 of the drain region.

Thermal oxide film 7 is formed to cover the main surface of silicon substrate 1. On thermal oxide film 7, a stacked structure 100 including floating gate electrode 8, ONO film 10 and control gate electrode 13 is provided. Stacked structure 100 has a side surface 101, and sidewall insulating film 38 is formed on the side surface.

Silicon oxide film 30, silicon nitride film 31 and silicon nitride film 40 are deposited on control gate electrode 13. It is noted that a silicon oxide film 35 is formed on the side surface of doped polysilicon layer 13a and floating gate electrode 8. Interlayer insulating film 41, silicon oxide film 62 and interconnection layer 28 are formed to cover stacked structure 100.

The nonvolatile semiconductor memory device includes silicon substrate 1 as a semiconductor substrate having main surface 1f, stacked structure 100 that has floating gate electrode 8 and control gate electrode 13 extending in a prescribed direction, is formed on main surface 1f, and includes side surface 101, source region 43 and impurity region (drain region) 34 formed in silicon substrate 1 on either side of stacked structure 100, and sidewall insulating film 38 covering side surface 101 of stacked structure 100. Source region 43 is positioned deeper than impurity region (drain region) 34 from main surface 1f.

Buried oxide film 6 as an isolation insulating film includes a silicon oxide film, and sidewall insulating film 38 includes a silicon nitride film. Silicide region 61 that is a part of source region 43 is formed by metallizing silicon substrate 1 using sidewall insulating film 38 as a mask.

Figure 3:
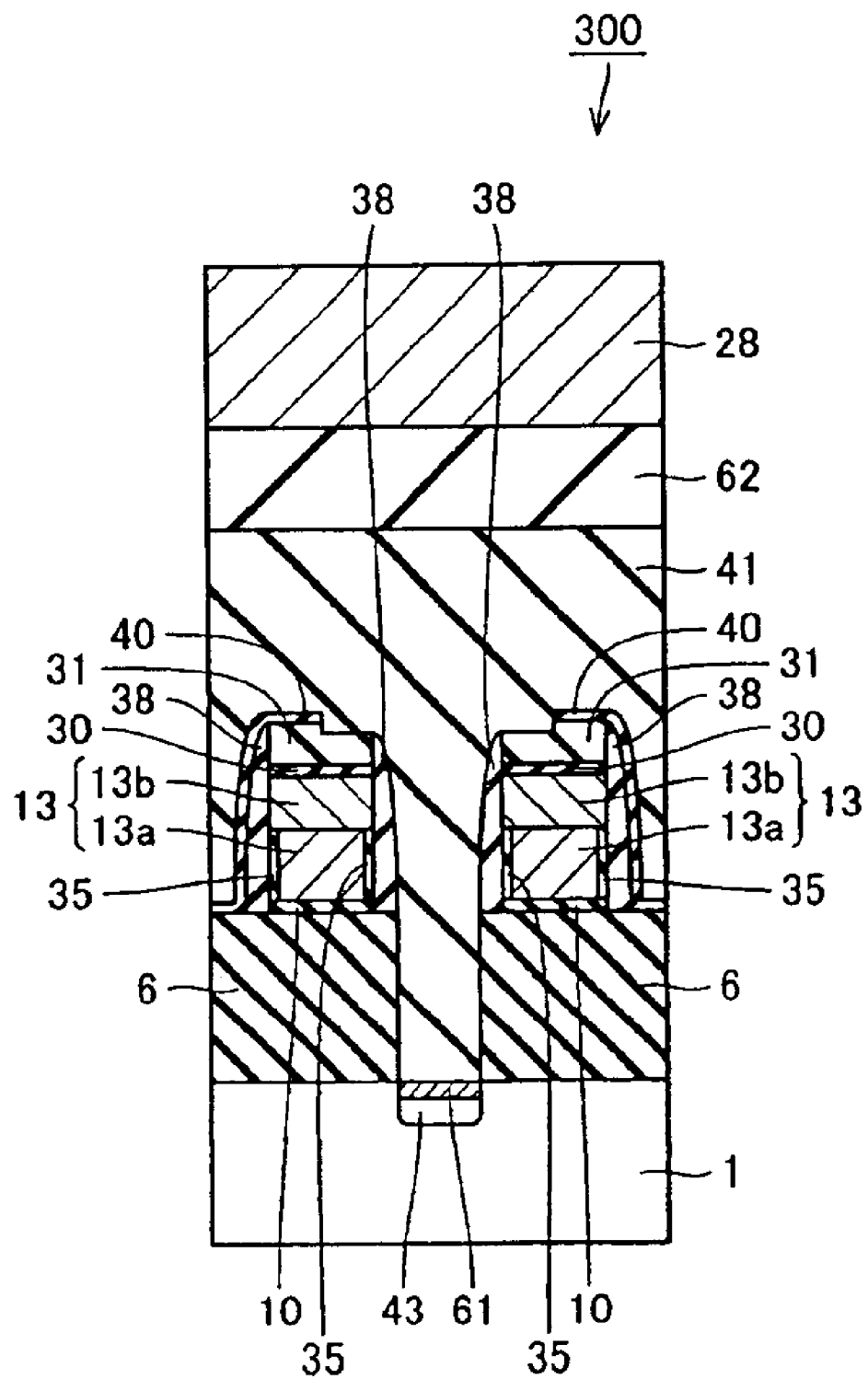
FIG. 3 is a cross sectional view taken along line III—III in FIG. 1A.

Referring to FIG. 3, buried oxide film 6 is formed in silicon substrate 1. Source region 43 is formed between buried oxide films 6. Source region 43 includes silicide region 61.

Control gate electrode 13, silicon oxide film 30, silicon nitride film 31, and silicon nitride film 40 are formed on buried oxide film 6.

Interlayer insulating film 41 and silicon oxide film 62 are formed to cover silicon nitride film 40. Interconnection layer 28 is formed on silicon oxide film 62.

Figure 4:
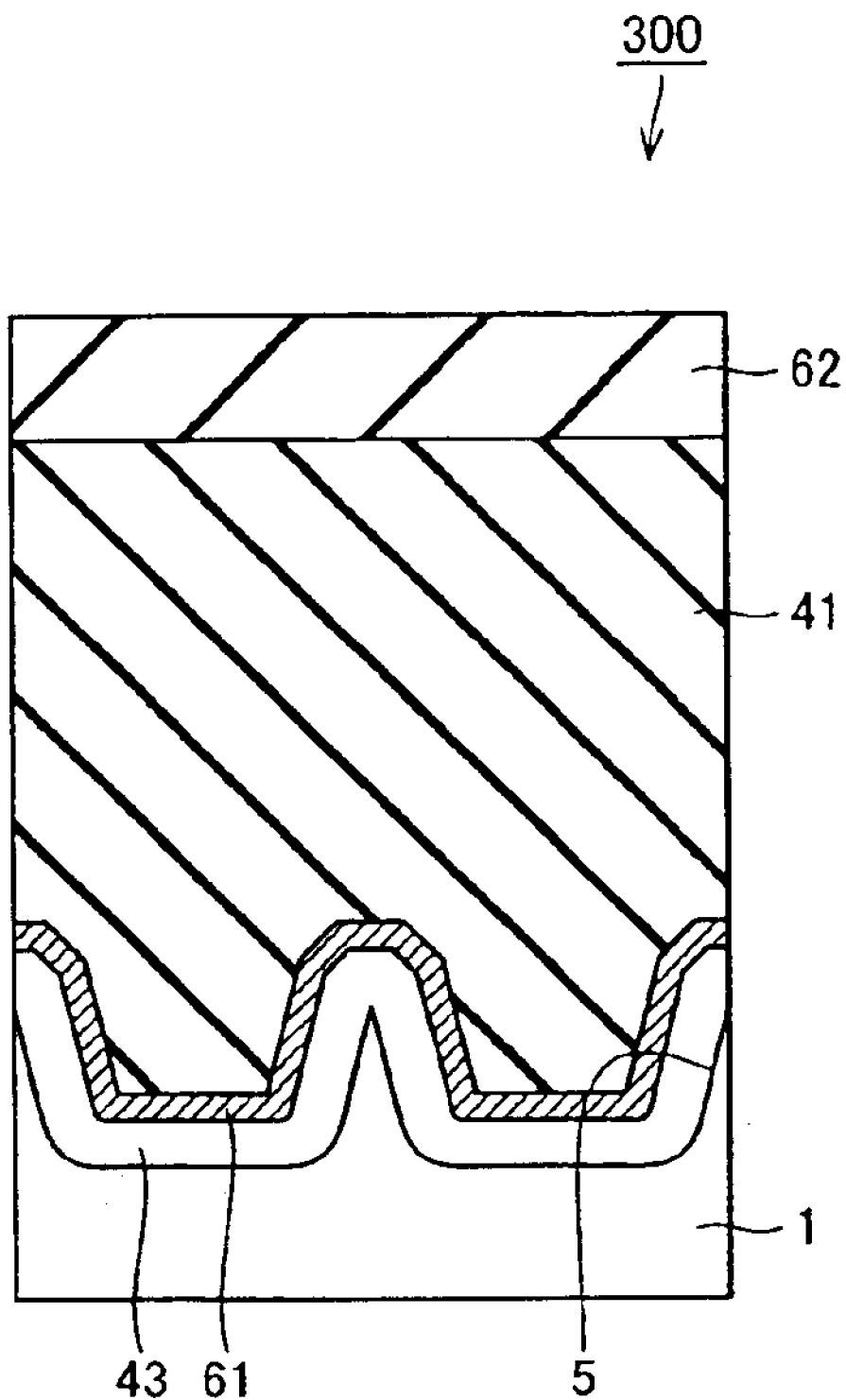
FIG. 4 is a cross sectional view taken along line IV—IV in FIG. 1A.

Referring to FIG. 4, trench 5 is formed in silicon substrate 1. Source region 43 including silicide region 61 is formed on the surface of trench 5. Source region 43 extends along the surface of trench 5.

A plurality of buried oxide films 6 as isolation insulating films are formed in the surface of silicon substrate 1. Part of source region 43 and silicide region 61 is formed between a plurality of buried oxide films 6.

A method of manufacturing the nonvolatile semiconductor memory device shown in FIG. 2 will be described with reference to FIGS. 5 to 28. It is noted that the cross sections shown in FIGS. 5A to 25A, 27A and 28A correspond to the cross section shown in FIG. 2A, the cross sections shown in FIGS. 5B to 25B, 27B and 28B correspond to the cross section shown in FIG. 2, and the cross sections shown in FIGS. 5C to 25C, 27C and 28C correspond to the cross section shown in FIG. 2C. Referring to FIGS. 5A to 5C, thermal oxide film 2 of about 20 nm thick is formed on main surface 1f of silicon substrate 1 as a semiconductor substrate. Silicon nitride film 3 of 20 nm thick is thereafter deposited. A resist pattern 4 is formed by applying a resist on silicon nitride film 3 and performing photolithography on the resist.

Referring to FIGS. 6A to 6C, using resist pattern 4 as a mask, silicon nitride film 3 and thermal oxide film 2 are dry-etched. After removing resist pattern 4, using the patterned silicon nitride film 3 and thermal oxide film 2 as a mask, silicon substrate 1 is dry-etched. Trench 5 having a depth of about 300 nm is thereby formed.

Figures 7A, 7B, 7C:
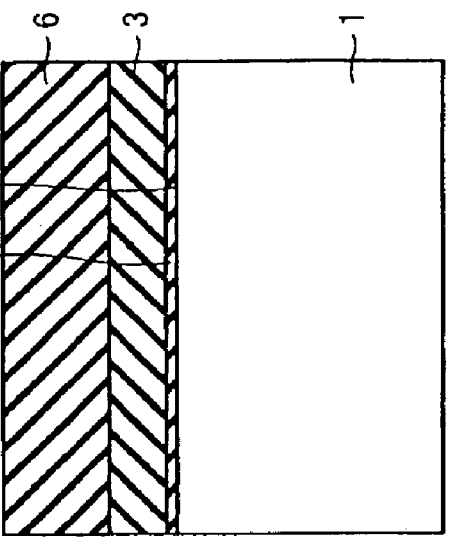

Referring to FIGS. 7A to 7C, in order to remove a plasma-damage layer in the etching of trench 5 and to round off the trench corner for preventing electric field concentration at the corner portion of trench 5, the inner wall of trench 5 is thermally oxidized by a depth of about 30 nm, and buried oxide film 6 of about 500 nm thick is deposited. Trench 5 is thus filled with an oxide film.

Figure 8A:
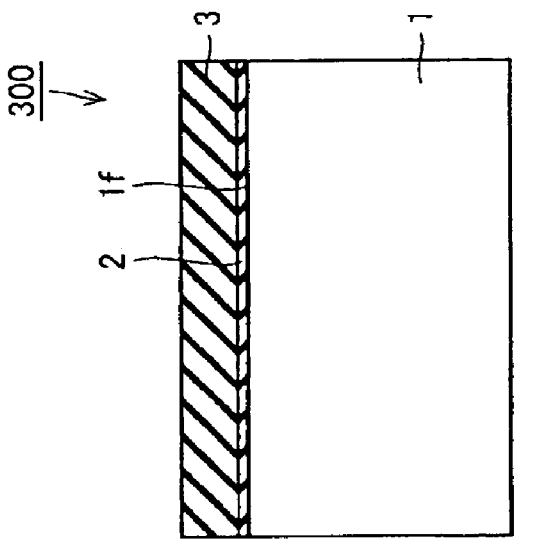
Figure 8B:
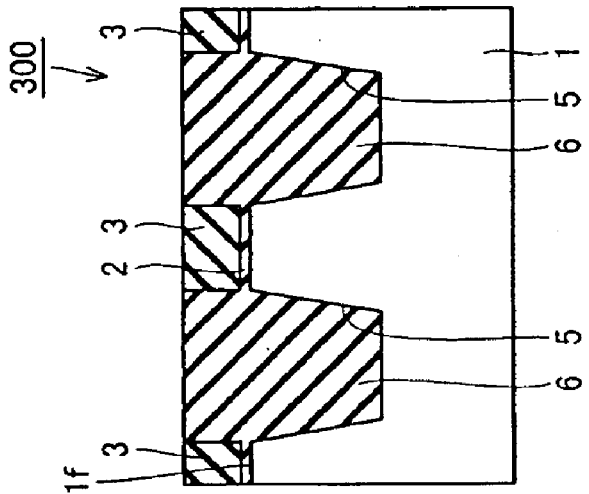
Figure 8C:
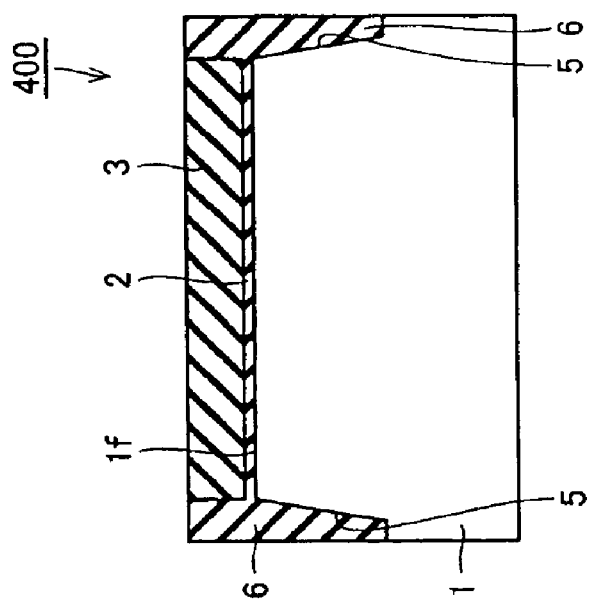

Referring to FIGS. 8A to 8C, buried oxide film 6 is planarized by chemical mechanical polishing (CMP).

Referring to FIGS. 9A to 9C, buried oxide film 6 is wet-etched by a prescribed amount using rare fluorine.

Referring to FIGS. 10A to 10C, silicon nitride film 3 is removed by hot phosphoric acid. At this point, a shallow trench isolation (STI) is formed.

Figures 11A, 11B, 11C:
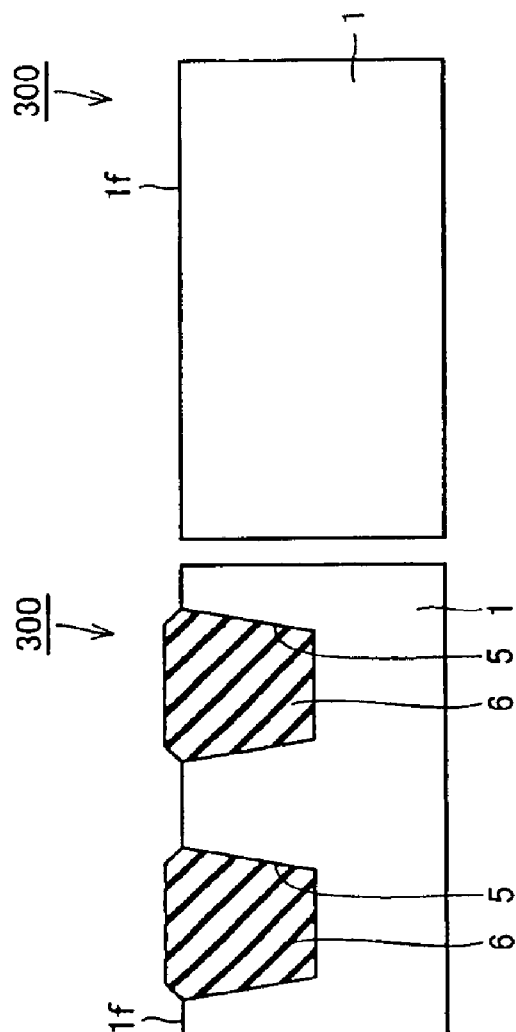

Referring to FIGS. 11A to 11C, ion implantation is performed for forming an n-type well region and a p-type well region (not shown). Thereafter, thermal oxide film 2 is removed by rare fluorine.

Figures 12A, 12B, 12C:
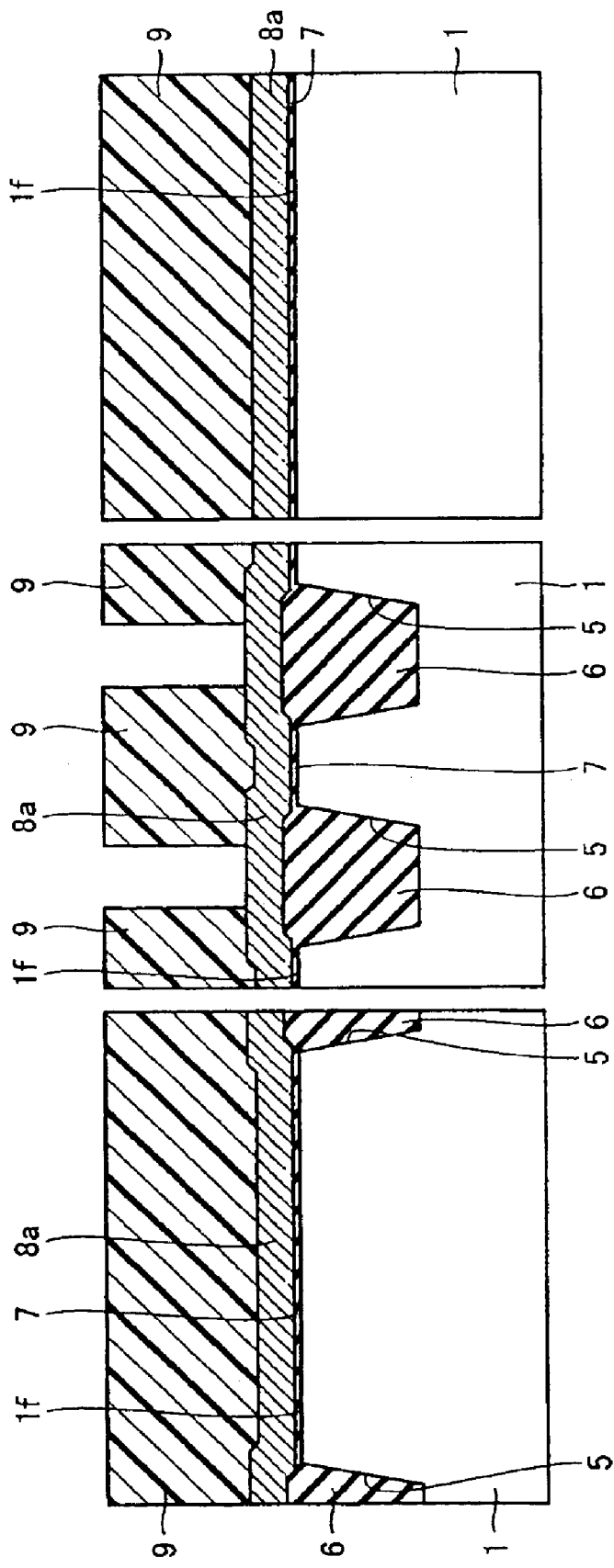

Referring to FIGS. 12A to 12C, thermal oxide film 7 of about 10 nm thick is formed serving as a tunnel oxide film of a memory cell. Furthermore, doped polysilicon layer 8a doped with phosphorous having a thickness of about 100 nm is formed serving as a floating gate of a memory cell. A resist pattern 9 is formed by applying a resist on doped polysilicon layer 8a and performing photolithography on the resist.

Referring to FIGS. 13A to 13C, doped polysilicon layer 8a is dry-etched using resist pattern 9 as a mask, for patterning of the floating gate electrode in the gate width direction. After removing resist pattern 9, ONO film 10 of three layers of an oxide film/a nitride film/an oxide film is formed on doped polysilicon layer 8a by forming a thermal oxide film of about 5 nm thick and thereafter depositing a silicon nitride film and a silicon oxide film.

Referring to FIGS. 14A to 14C, a resist pattern 11 is formed by applying a resist on silicon substrate 1 and performing photolithography on the resist. Resist pattern 11 exposes peripheral circuit region 400 and covers memory cell region 300.

Referring to FIGS. 15A to 15C, ONO film 10 and doped polysilicon layer 8a in peripheral circuit region 400 are removed by dry-etching using resist pattern 11 as a mask. Thereafter, thermal oxide film 7 is removed by rare fluorine.

Referring to FIGS. 16A to 16C, after removing resist pattern 11, thermal oxide film 12 of about 15 nm thick is formed serving as a gate oxide film of peripheral circuit region 400. Doped polysilicon layer 13a doped with phosphorous having a thickness of about 100 nm and tungsten silicide (WSi) are then deposited, serving as the control gate electrode of memory cell region 300 and the gate electrode of peripheral circuit region 400. Silicon oxide film 30 of about 10 nm thick and silicon nitride film 31 of about 200 nm thick are further deposited thereon.

A resist pattern 32 is formed by applying a resist on silicon nitride film 31 and performing photolithography on the resist.

Referring to FIGS. 17A to 17C, silicon nitride film 31 and silicon oxide film 30 are dry-etched using resist pattern 32 as a mask. After removing resist pattern 32, using the patterned silicon nitride film 31 and silicon oxide film 32 as a mask, tungsten silicide (WSi) layer 13b and doped polysilicon layer 13a are dry-etched to form control gate electrode 13 in memory cell region 300 and gate electrode 14 in peripheral circuit region 400.

Referring to FIGS. 18A to 18C, a resist is applied to cover silicon substrate 1. A resist pattern 33 is formed by performing photolithography on the resist. Resist pattern 33 covers peripheral circuit region 400.

Figures 19A, 19B, 19C:
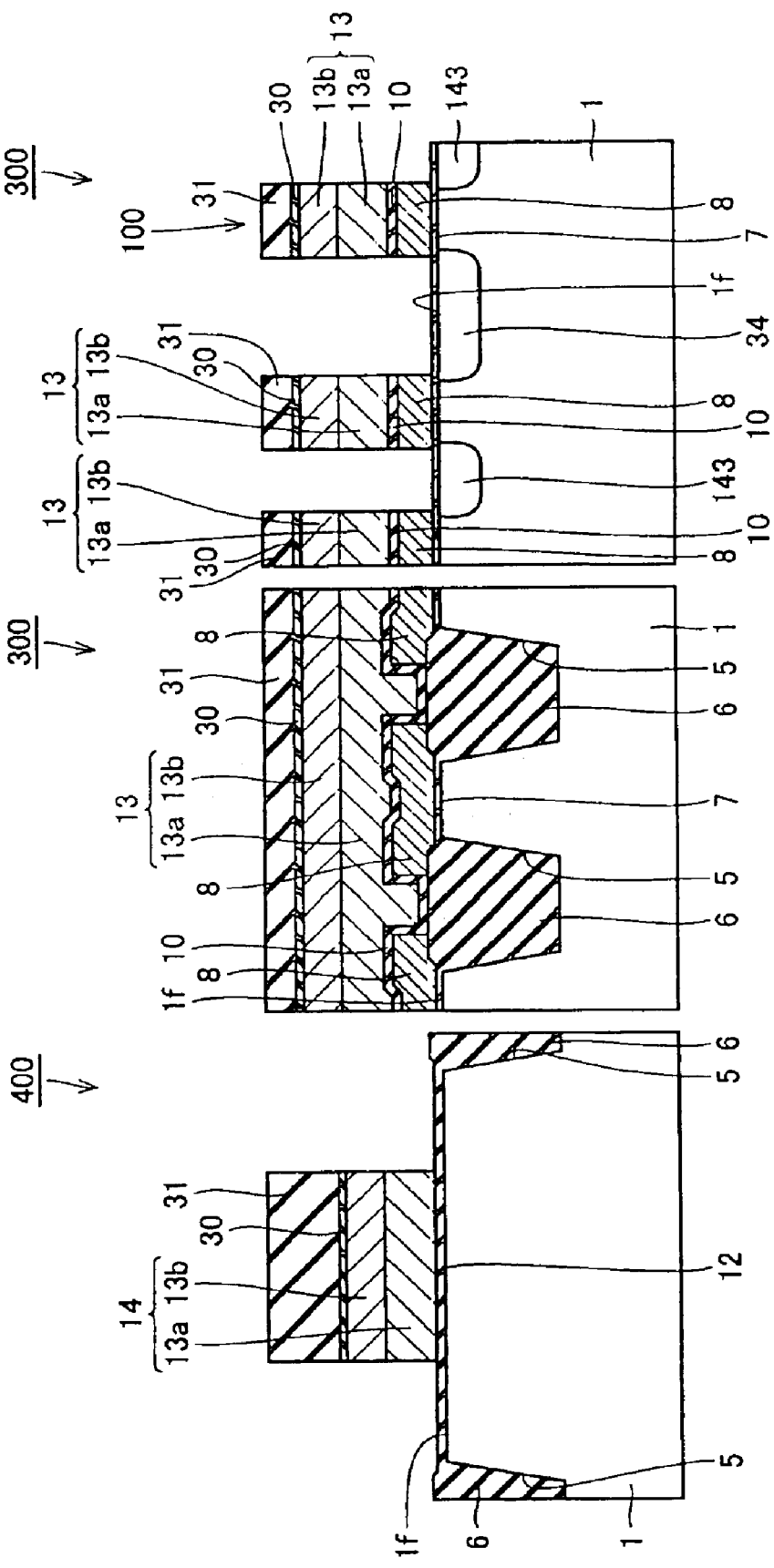

Referring to FIGS. 19A to 19C, using resist pattern 33 and the patterned silicon nitride film 31, silicon oxide film 30, tungsten silicide layer 13b, and doped polysilicon layer 13a as a mask, ONO film 10 and doped polysilicon layer 8a in memory cell region 300 are dry-etched for patterning of the floating gate electrode in the gate length (L) direction. Floating gate electrode 8 is thus formed. Impurity ions are then implanted in silicon substrate 1 to form impurity regions 34 and 143 in memory cell region 300. Impurity region 34 is a drain region. Thereafter, resist pattern 33 is removed.

Referring to FIGS. 20A to 20C, silicon oxide film 35 of about 10 nm thick is formed by thermal oxidation on the sidewalls of doped polysilicon layer 13a and floating gate electrode 8. Impurity region 37 is formed in peripheral circuit region 400 by implanting impurity ions in silicon substrate 1. Silicon nitride film 36 of about 100 nm thick is deposited to cover the entire, silicon substrate 1.

Figures 21A, 21B, 21C:
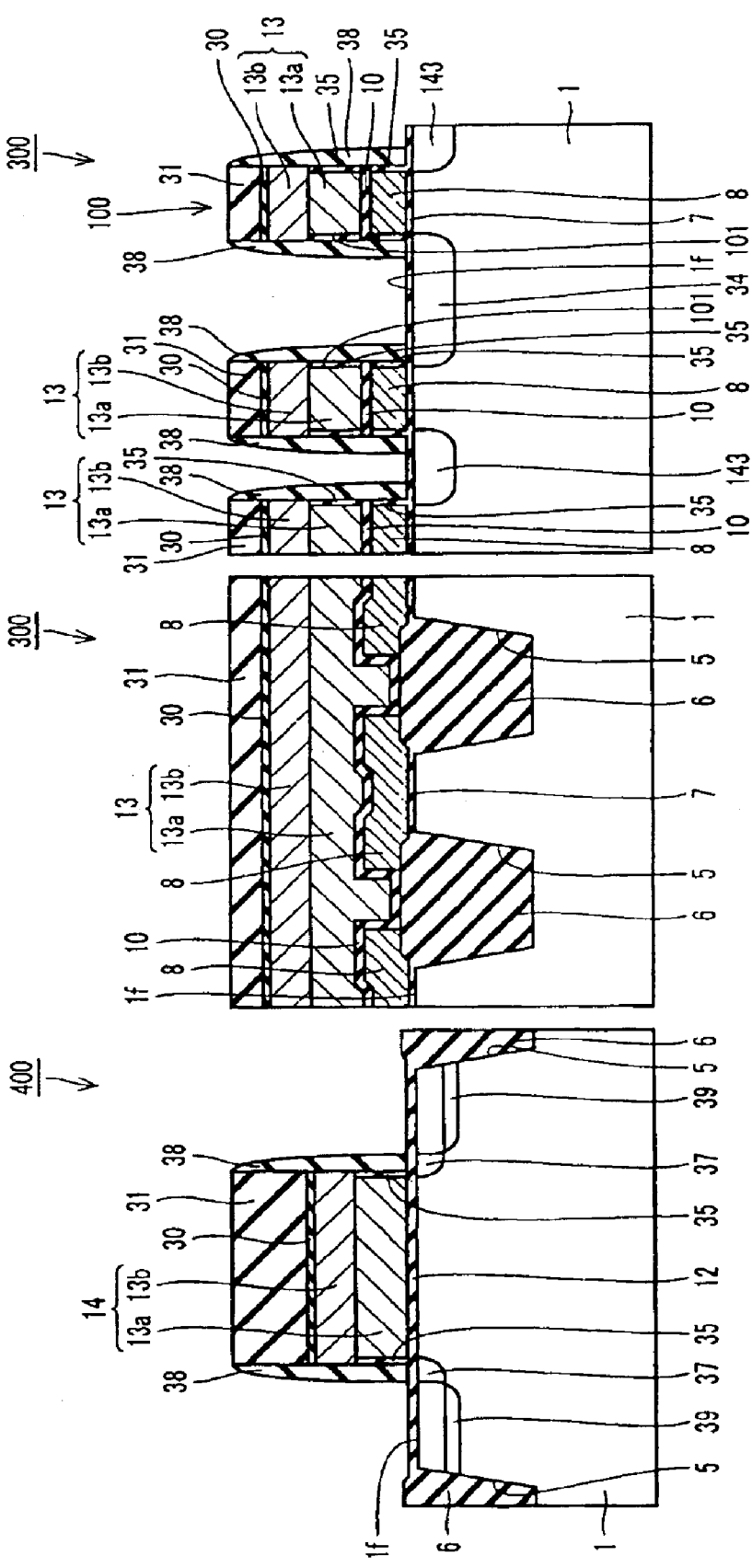

Referring to FIGS. 21A to 21C, sidewall insulating film 38 is formed by etching back silicon nitride film 36. The heavily-doped impurity region 39 in peripheral circuit region 400 is then formed by implanting impurity ions.

Referring to FIGS. 22A to 22C, silicon nitride film 40 of about 20 nm thick is deposited serving as an etching stopper. Thereafter, interlayer insulating film 41 is formed of BPSG (boron phosphorus silicate glass) having a thickness of about 1000 nm. Interlayer insulating film 41 is planarized by CMP or the like.

Figure 23A:
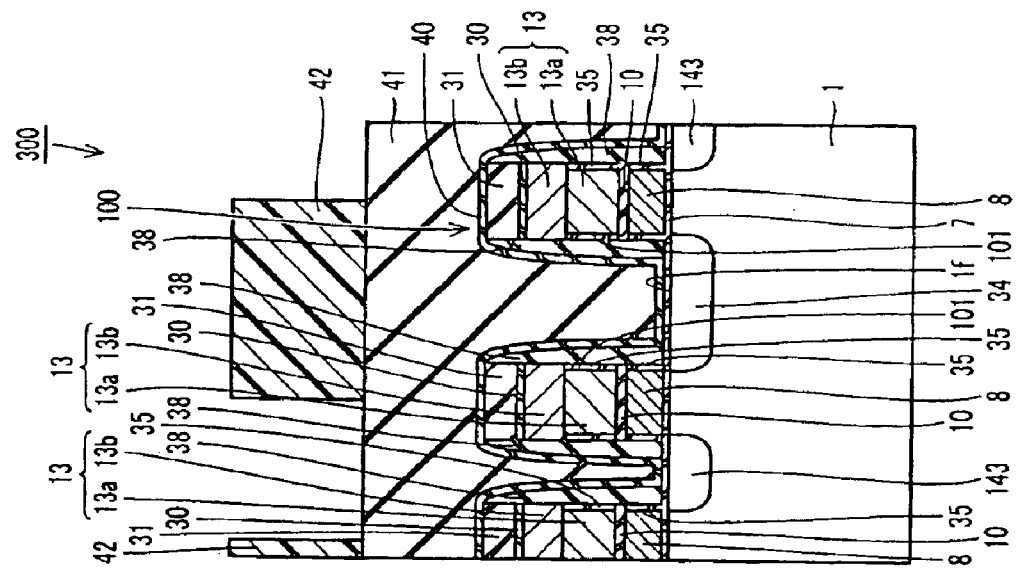
Figure 23B:
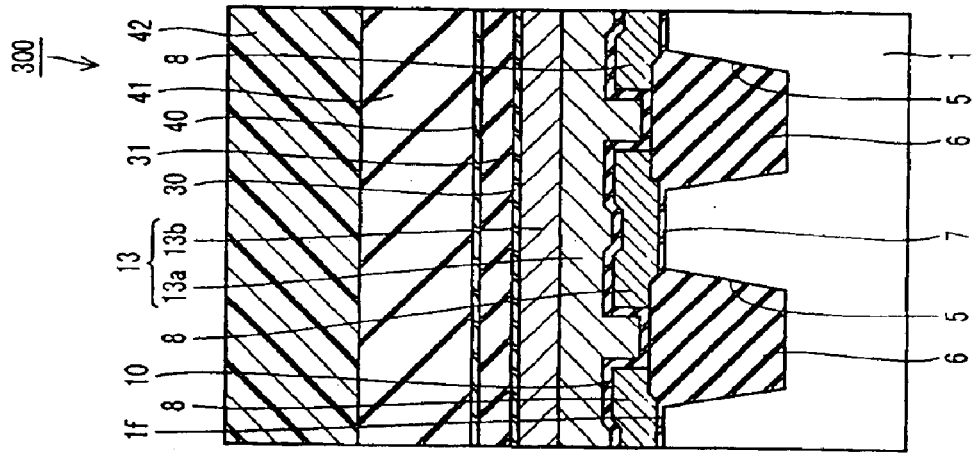
Figure 23C:
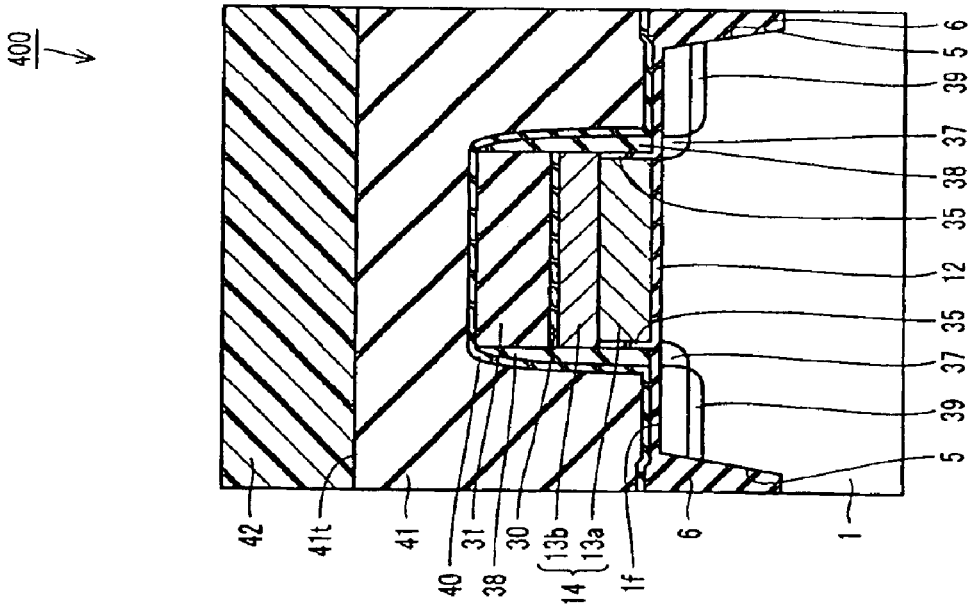

Referring to FIGS. 23A to 23C, a resist is applied on interlayer insulating film 41. By performing photolithography on this resist, a resist pattern 42 is formed to cover peripheral circuit region 400 and half of the drain side of memory cell region 300. At this point, a top surface 41t of the underlying interlayer insulating film 41 is approximately parallel to main surface 1f and flat, thereby allowing accurate photolithography.

Referring to FIGS. 24A to 24C, interlayer insulating film 41 is dry-etched using resist pattern 42 as a mask. A groove 41h parallel to control gate electrode 13 is thereby formed on the source region of memory cell region 300. Here, penetration of silicon nitride film 40 is prevented by adopting the conditions under which silicon nitride film 40 is not etched while the etching of interlayer insulating film 41 is facilitated, that is, the etching conditions of higher selectivity to silicon nitride film 40.

Figure 25A:
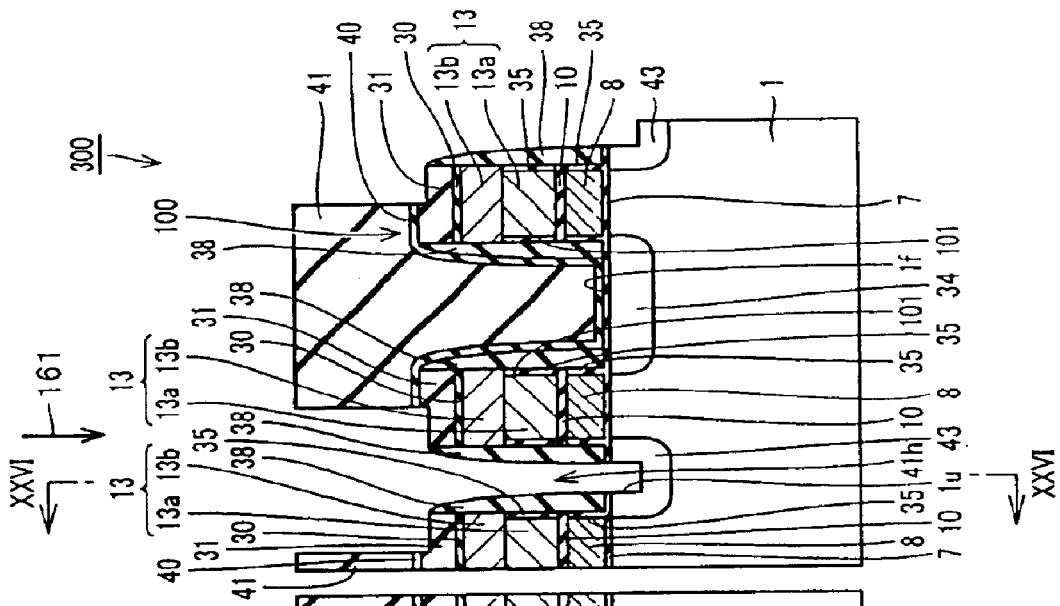
Figure 25B:
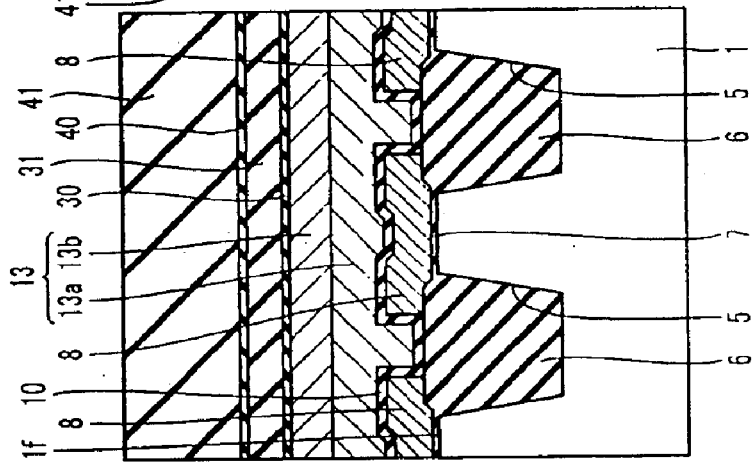
Figure 25C:
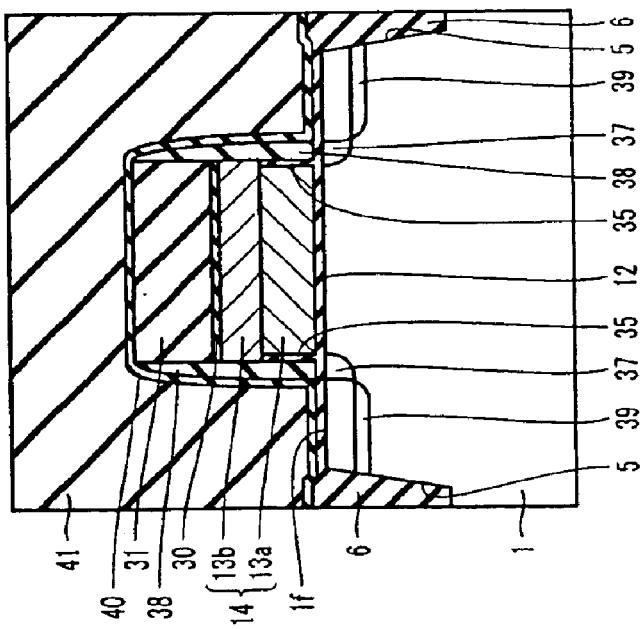
Figure 26:
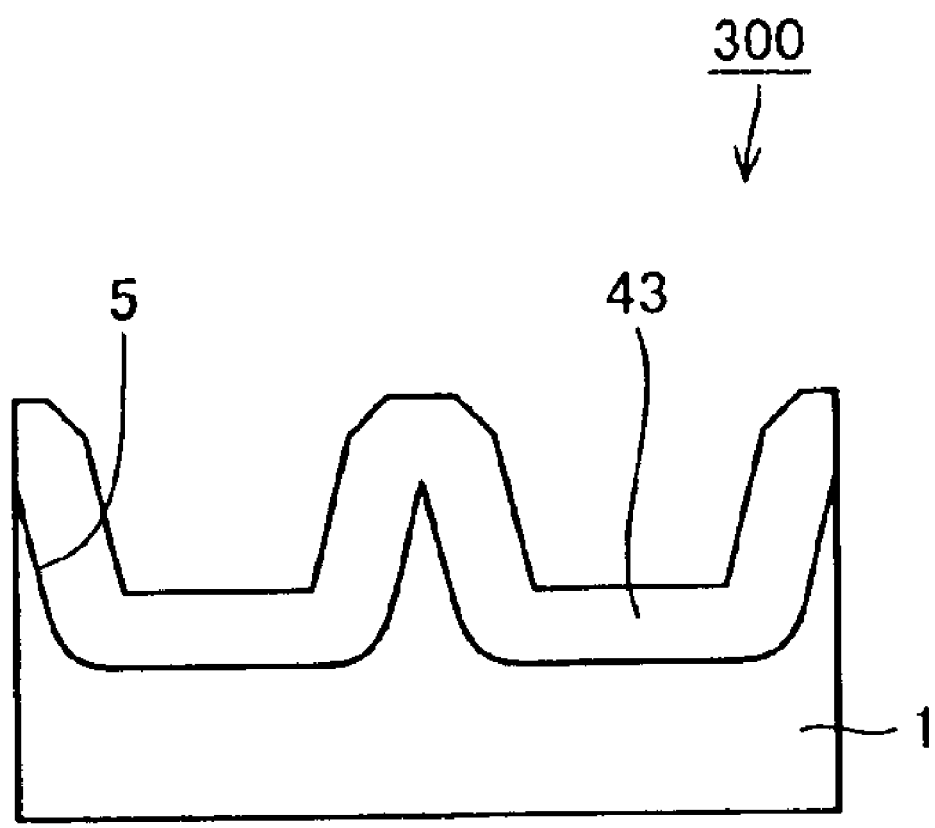
FIG. 26 is a cross sectional view taken along line XXVI—XXVI in FIG. 25C.

Referring to FIGS. 25A to 25C, silicon nitride film 40 is etched with the etching conditions changed. Buried oxide film 6 is removed with the conditions being further changed again to higher selectivity to the silicon nitride film. As shown in FIG. 25C, recessed portion 1u is formed in silicon substrate 1. As shown in FIG. 26, after removing the buried oxide film, ion implantation is performed from the direction indicated by arrow 161 to connect the impurity regions of adjacent memory cells in the gate width direction, thereby forming source region 43. In other words, as shown in FIG. 26, source region 43 is formed along trench 5. It is noted that prior to this step, between the adjacent memory cells in the gate width direction, the impurity region is isolated by the trench element-isolation.

Referring to FIGS. 27A to 27C, a refractory metal layer 60 such as cobalt or titanium of about 10 nm thick is deposited.

Figures 28A, 28B, 28C:
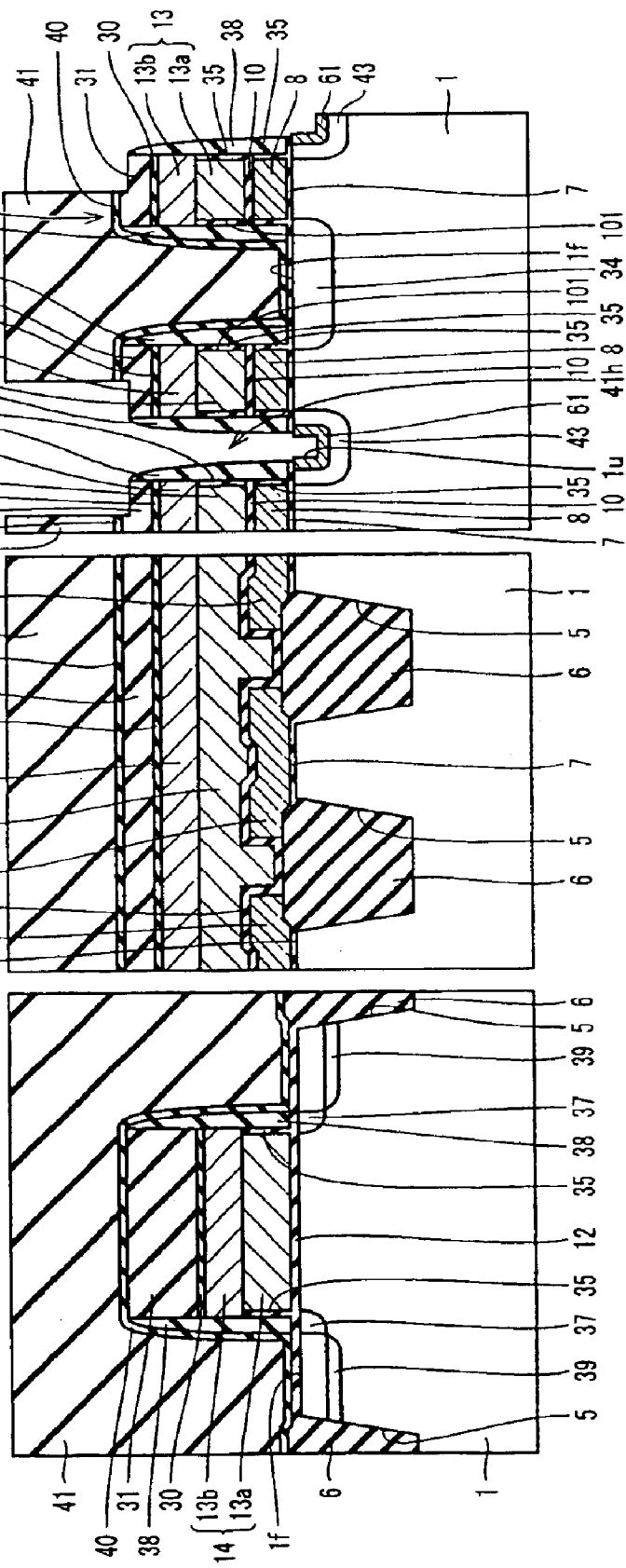

Referring to FIGS. 28A to 28C, heat treatment for silicidation is performed. Thereafter, unreacted refractory metal layer 60 is removed. Since silicon is exposed only at the surface of source region 43 at this point of time, the surface of source region 43 serves as silicide region 61.

Referring to FIGS. 2A to 2C, the surface of the source region 43 is covered by depositing silicon oxide film 62 of about 500 nm thick. Thereafter, a resist pattern is formed by applying a resist on silicon oxide film 62 and performing photolithography on the resist. Using the resist pattern as a mask, silicon oxide film 62 and interlayer insulating film 41 are etched to form contact hole 41a. Contact hole 41a reaches main surface 1f of silicon substrate 1. A doped polysilicon layer is formed to cover contact hole 41a, and this doped polysilicon layer is patterned to a prescribed shape to form interconnection layer 28. The nonvolatile semiconductor memory device shown in FIGS. 2A to 2C are thereby finished.

The method of manufacturing a nonvolatile semiconductor memory device as described above includes the steps of: forming on main surface 1f of silicon substrate 1 a plurality of stacked structures 100 each including side surface 101 and having a plurality of floating gate electrodes 8 and control gate electrode 13 formed on a plurality of floating gate electrodes 8 to extend in a prescribed direction; forming silicon nitride film 36 as an insulating film that covers side surfaces 101 of a plurality of stacked structures 100 and main surface 1f of silicon substrate 1; etching back silicon nitride film 36 while leaving silicon nitride film 36 that covers side surface 101 of stacked structure 100, to form sidewall insulating film 38; forming interlayer insulating film 41 that covers stacked structure 100 and sidewall insulating film 38 and has top surface 41t approximately parallel to main surface 1f; forming resist pattern 42 as a mask layer on top surface 41t of interlayer insulating film 41; forming groove 41h as an opening in interlayer insulating film 41 to be positioned between sidewall insulating films 38 formed at adjacent stacked structures 100 by selectively etching interlayer insulating film 41 using resist pattern 42 as a mask; and forming source region 43 that extends along a plurality of floating gate electrodes 8 by implanting impurity ions in main surface 1f from groove 41h. The method of manufacturing a nonvolatile semiconductor memory device further includes the step of forming silicide region 61 as the step of metallizing a part of source region 43.

The method of manufacturing a nonvolatile semiconductor memory device includes the steps of: forming on main surface 1f of silicon substrate 1 a plurality of stacked structures 100 each including side surface 101 and having a plurality of floating gate electrodes 8 and control gate electrode 13 formed on a plurality of control gate electrodes 8 to extend in a prescribed direction; forming silicon nitride film 36 that covers stacked structure 100; forming sidewall insulating film 38 that covers side surfaces 101 of a plurality of stacked structures by etching back silicon nitride film 36; and forming source region 43 that extends along a plurality of floating gate electrodes 8, in silicon substrate 1 between a plurality of stacked structures 100.

The method of manufacturing a nonvolatile semiconductor memory device further includes the step of forming a plurality of buried oxide films 6 as isolation insulating films at silicon substrate 1, wherein a part of source region 43 is formed between a plurality of buried oxide films. Silicon nitride film 40 is formed on sidewall insulating film 38. The method of manufacturing a nonvolatile semiconductor memory device further includes the step of metallizing a part of source region 43 using sidewall insulating film 38 and silicon nitride film 40 as a mask.

In the nonvolatile semiconductor memory device configured as described above, source region 43 includes silicide region 61. As a result, the resistance of source region 43 can be reduced. Furthermore, the depth of source region 43 is larger than the depth of impurity region 34 as a drain region, and source region 43 is formed at recessed portion 1u provided by etching silicon substrate 1 using sidewall insulating film 38 as a mask. As a result, the distance between source region 43 and floating gate electrode 8 can be increased, thereby preventing short-circuit between source region 43 and floating gate electrode 8.

In addition, as shown in FIG. 3, since source region 43 is formed between a plurality of buried oxide films 6, the spaces between buried oxide films 6 as isolation regions can be used effectively.

Since source region 43 is formed by implanting an impurity in silicon substrate 1 using sidewall insulating film 38 formed in a self-aligned manner as a mask, source region 43 can be formed reliably between a plurality of stacked structures 100 even when the gaps between a plurality of stacked structures are reduced in size. As a result, the nonvolatile semiconductor memory device can be miniaturized.

In addition, since resist pattern 42 is formed on the flat top surface 41t, it is possible to enlarge a margin for registration in the step of forming resist pattern 42 and to improve the scalability. In this manufacturing method, similar to SAC (self-aligned contact), source region 43 is formed in a manner self-aligned to the nitride film. In the step of forming recessed portion 1u, thermal oxide film 7 under floating gate electrode 8 is protected by sidewall insulating film 38, resulting in the effect that it is free from plasma damage.

In this manufacturing method, the drain region in memory cell region 300 and the source and drain region in the peripheral circuit region are not silicidized. Silicidation effectively reduces the resistance but may incur increased junction leakage. Such a problem can be prevented by silicidizing only source region 43 where the reduced resistance is desired most.

Second Embodiment

Figure 29A:
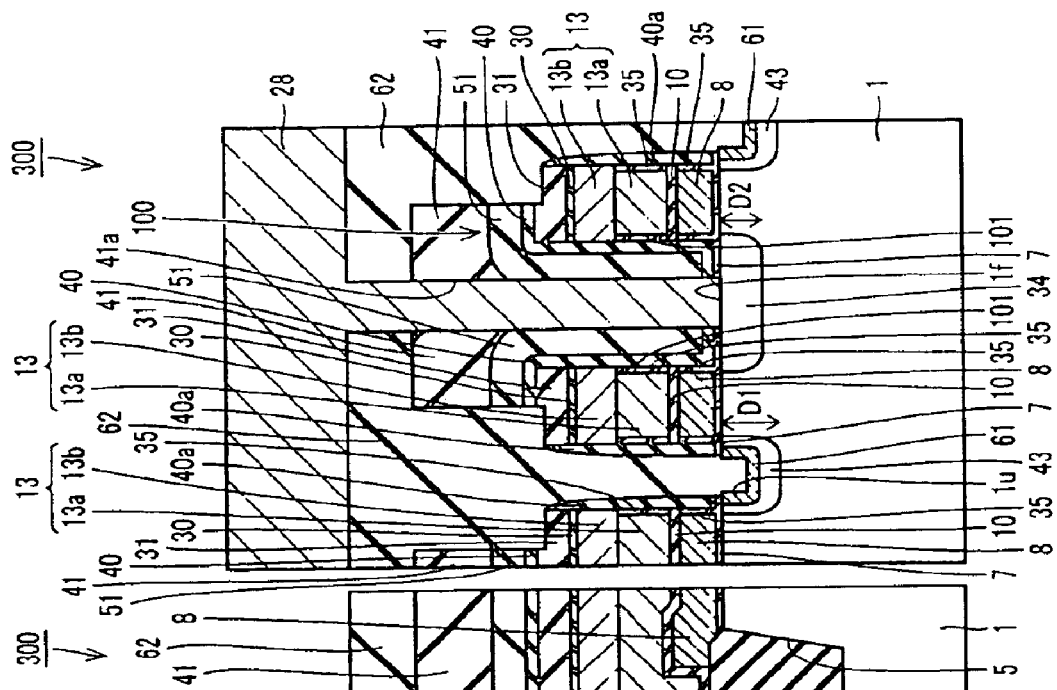
FIGS. 29A–29C are cross sectional views of a nonvolatile semiconductor memory device in accordance with a second embodiment of the present invention, where
Figure 29B:
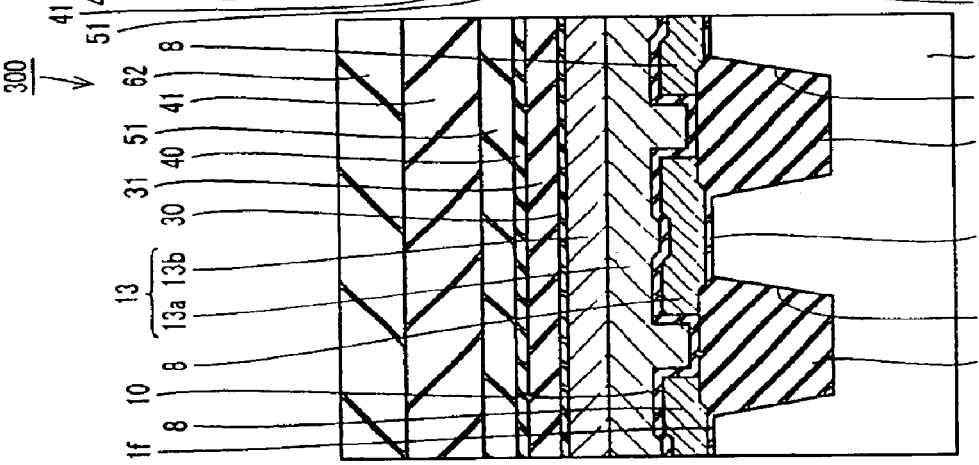
Figure 29C:
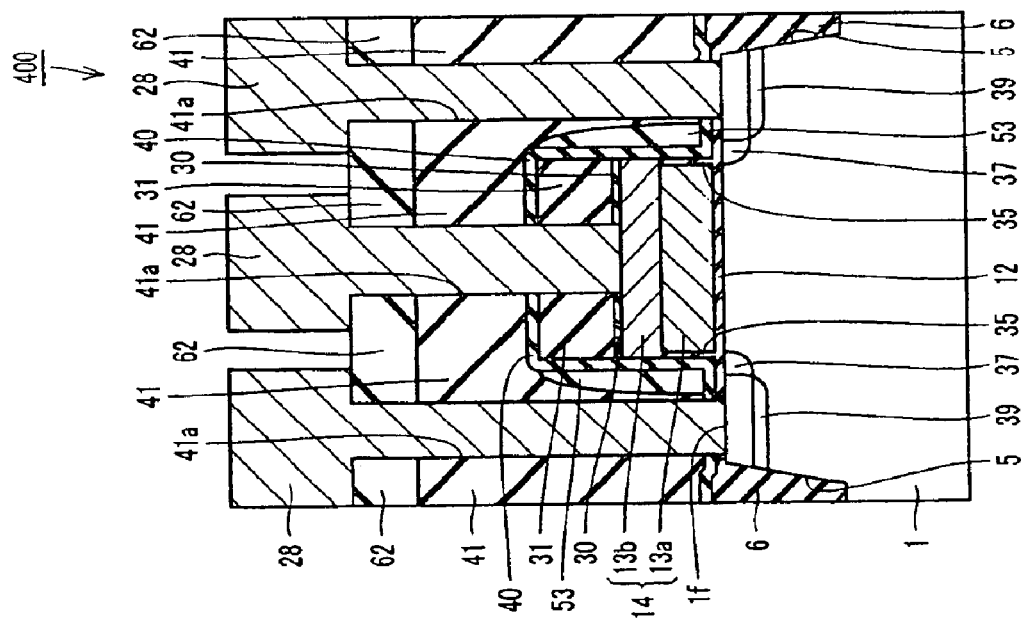

Referring to FIGS. 29A to 29C, the nonvolatile semiconductor memory device in accordance with a second embodiment of the present invention differs from the nonvolatile semiconductor memory device in the first embodiment in that a silicon oxide film 51 is formed.

A method of manufacturing a nonvolatile semiconductor memory device shown in FIG. 29 will be described. The cross sections shown in FIGS. 30A to 35A, 37A and 38A correspond to the cross section shown in FIG. 29A, the cross sections shown in FIGS. 30B to 35B, 37B and 38B correspond to the cross section shown in FIG. 29B, and the cross sections shown in FIGS. 30C to 35C, 37C, and 38C correspond to the cross section shown in FIG. 29C. Referring to FIGS. 30A to 30C, first, according to the steps similar to those in the first embodiment, gate electrode 14 is formed in peripheral circuit region 400 and stacked structure 100 is formed in memory cell region 300.

Referring to FIGS. 31A to 31C, the sidewalls of doped polysilicon layer 13a and floating gate electrode 8 are thermally oxidized to form silicon oxide film 35 of about 10 nm thick. Then, by performing ion implantation on silicon substrate 1, lightly-doped impurity region 37 is formed in peripheral circuit region 400. Thereafter, silicon nitride film 40 of about 50 nm thick is formed to cover silicon substrate 1.

Referring to FIGS. 32A to 32C, silicon oxide film 51 of about 100 nm thick is deposited and the resist is thereafter applied on silicon oxide film 51. A resist pattern 52 is formed by performing photolithography on the resist.

Figures 33A, 33B, 33C:
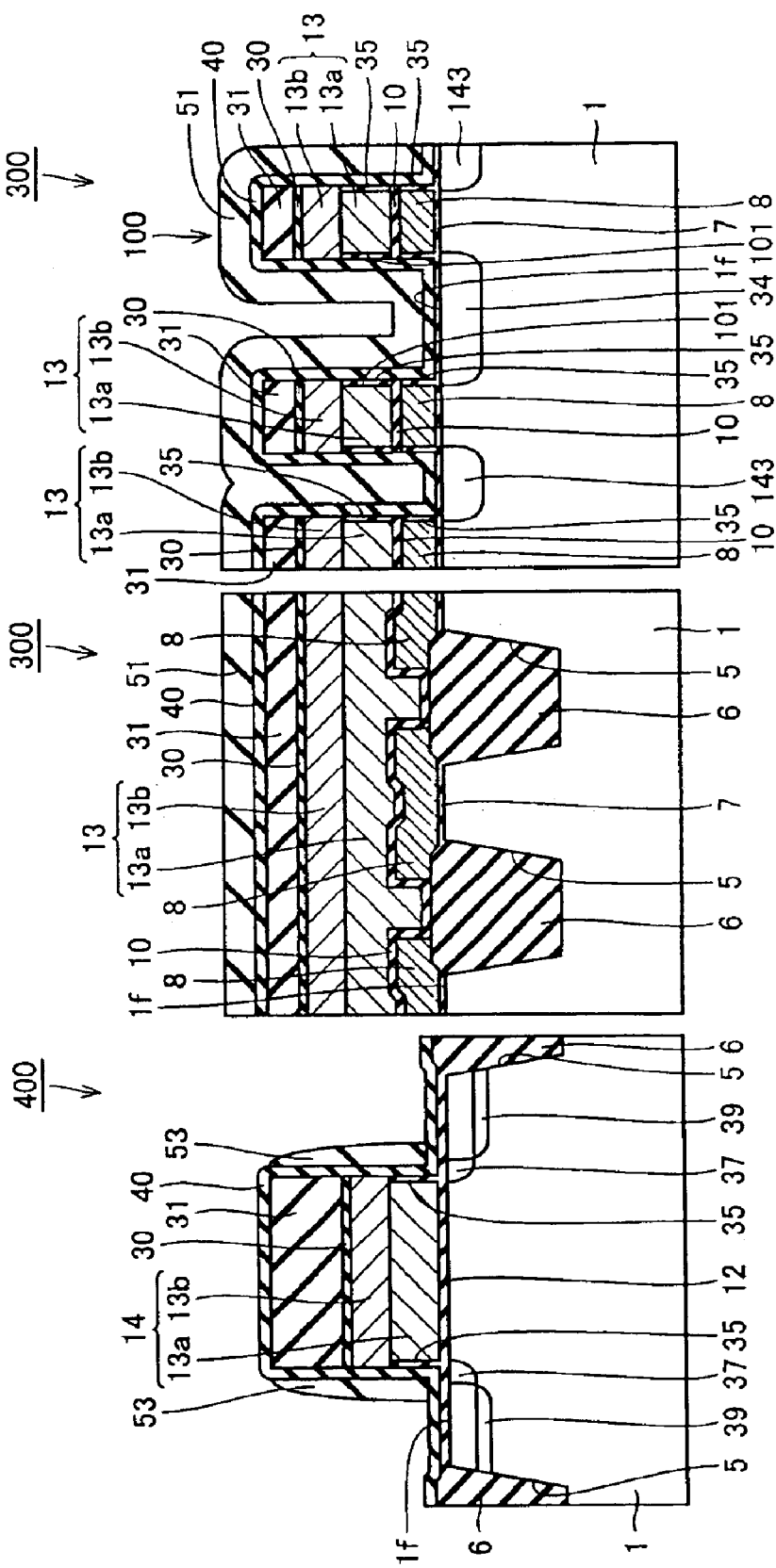

Referring to FIGS. 33A to 33C, a silicon oxide film 53 is formed by etching silicon oxide film 51 in peripheral circuit region 400. Thereafter, heavily-doped impurity region 39 is formed in peripheral circuit region 400 by implanting impurity ions in peripheral circuit region 400.

In the first embodiment, the sidewall insulating film in the memory cell region for forming a source region in a self-aligned manner is formed at the same time when the sidewall insulating film for forming the structure of the source and drain region of the transistor in peripheral circuit region as a LDD (lightly-doped-drain) structure is formed. With this method, however, the optimum sidewall widths for the respective sidewall insulating films may not be equal.

When the sidewall insulating film is formed of the minimum width required for forming a source region in a self-aligned manner, the width of the sidewall insulating film of the transistor formed at the same time in the peripheral circuit region may be larger than the minimum width of the sidewall insulating film required in the memory cell region. In such a case, the width of the sidewall insulating film of the memory cell region has to be increased in order to form the both of them at the same time. As a result, memory cell region 300 is enlarged.

By contrast, in the present embodiment, the widths of the sidewall insulating films in memory cell region 300 and peripheral circuit region 400 can be set independently, so that memory cell region 300 can be reduced in size as compared with the first embodiment.

Referring to FIGS. 34A to 34C, interlayer insulating film 41 of BPSG having a thickness of about 1000 nm is deposited. Interlayer insulating film 41 is planarized by CMP or the like to form top surface 41t approximately parallel to main surface 1f. Resist pattern 56 is formed by applying a resist on top surface 41t of interlayer insulating film 41 and performing photolithography on the resist. Resist pattern 56 covers peripheral circuit region 400 and half of the drain side of the memory cell. Using resist pattern 56 as a mask, interlayer insulating film 41 is dry-etched to form groove 41h parallel to control gate electrode 13, on the source region. Here, penetration of silicon nitride film 40 is prevented by applying the etching conditions of higher selectivity to silicon nitride film 40. Since the underlayer is flat at this point of time, accurate photolithography can be performed, as similar to the first embodiment.

Figures 35A, 35B, 35C:
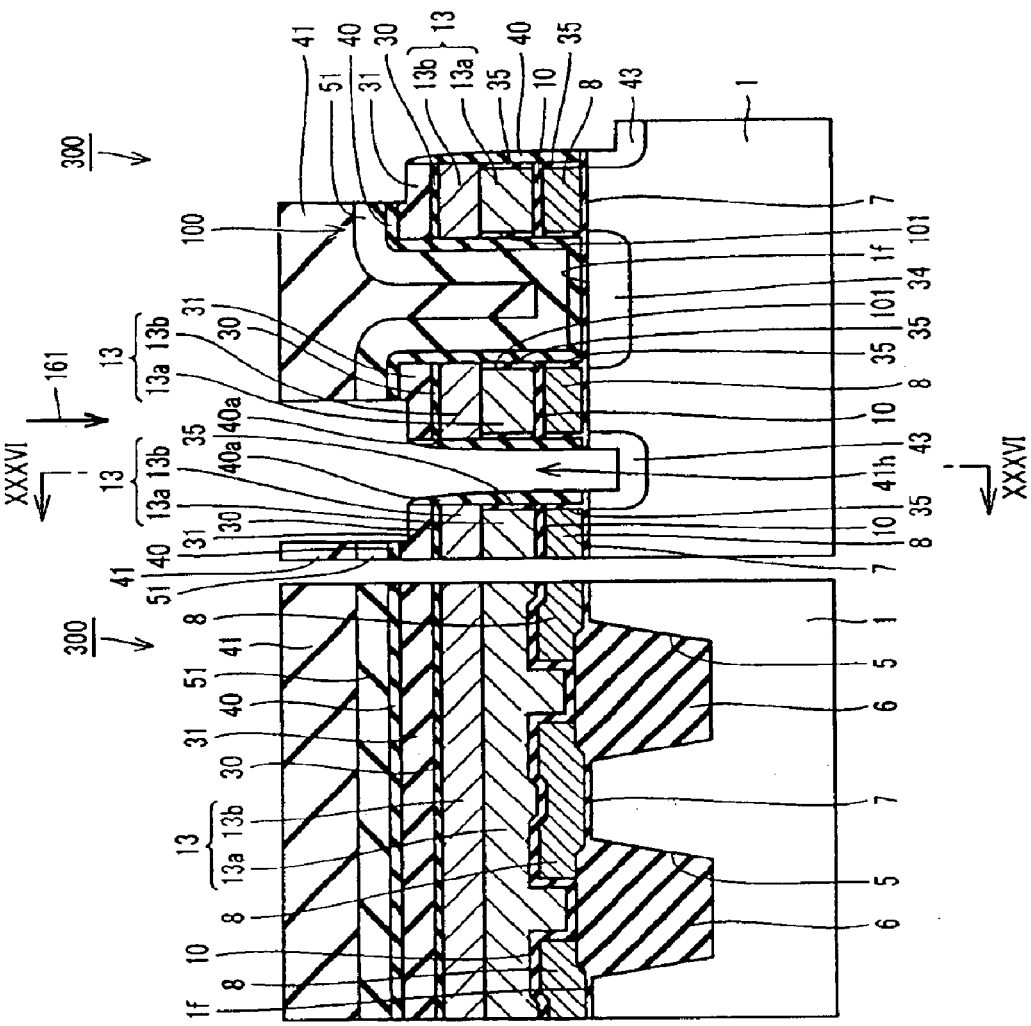
Figure 36:
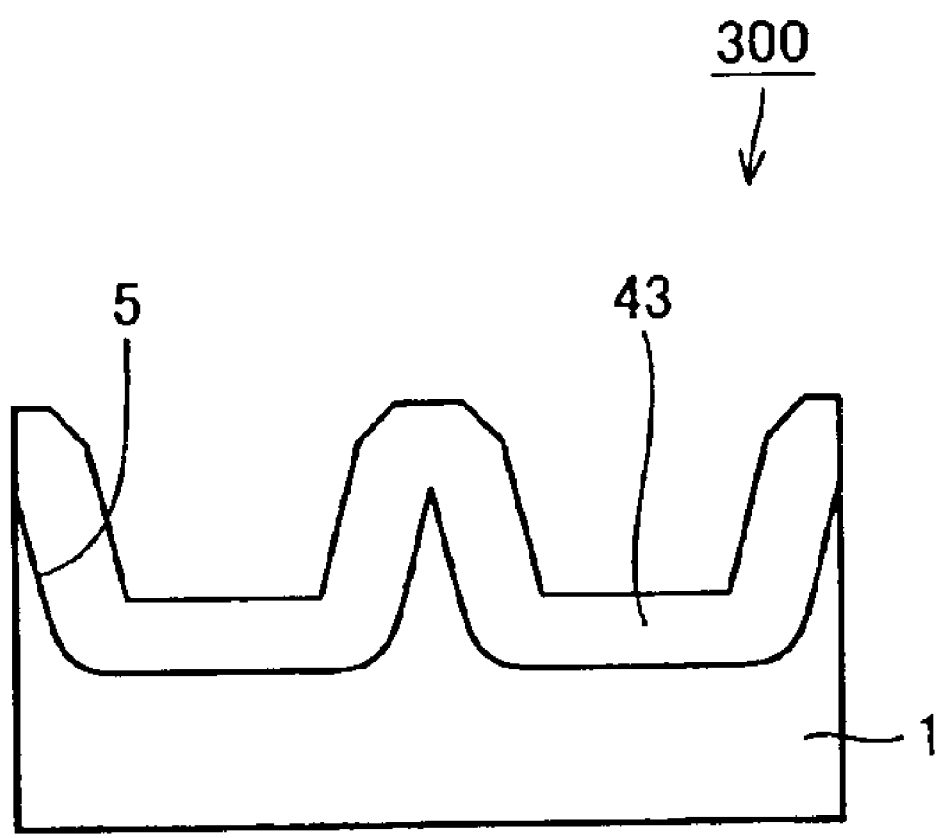
FIG. 36 is a cross sectional view taken along line XXXVI—XXXVI in FIG. 35.

Referring to FIGS. 35A to 35C, with the etching conditions being changed, silicon nitride film 40 is etched back to form sidewall insulating film 40a. So far, the present method is similar to SAC (self align contact) in which a contact hole is formed in a self-aligned manner, except that a hole pattern is changed to a line pattern. Buried oxide film 6 is removed with the etching conditions being further changed again to higher selectivity to the silicon nitride film. Thereafter, by implanting impurity ions from the direction indicated by arrow 161, source region 43 is formed to extend along the direction in which floating gate electrodes 8 are provided in line. As shown in FIG. 36, buried oxide film 6 is removed on source region 43.

Figures 37A, 37B, 37C:
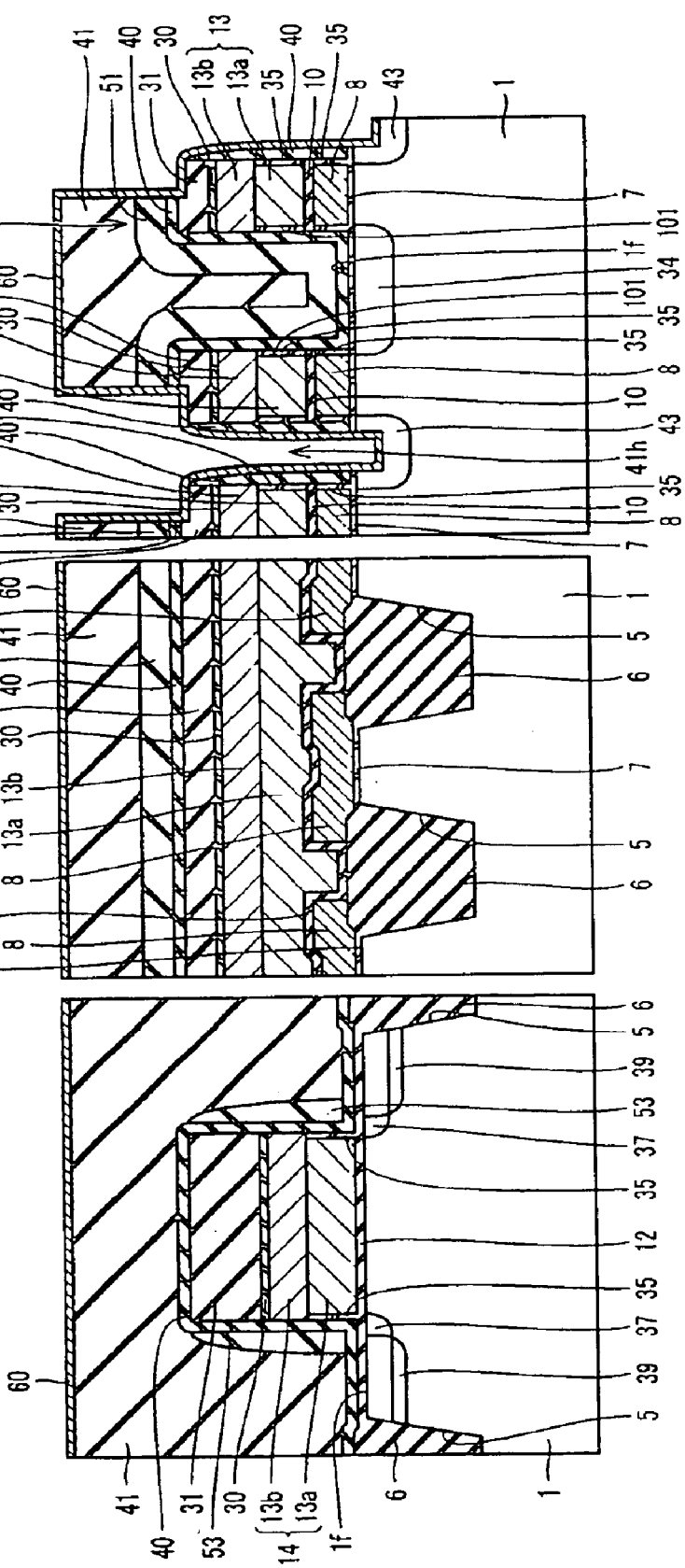

Referring to FIGS. 37A to 37C, refractory metal layer 60 such as cobalt or titanium of about 10 nm thick is deposited.

Figures 38A, 38B, 38C:
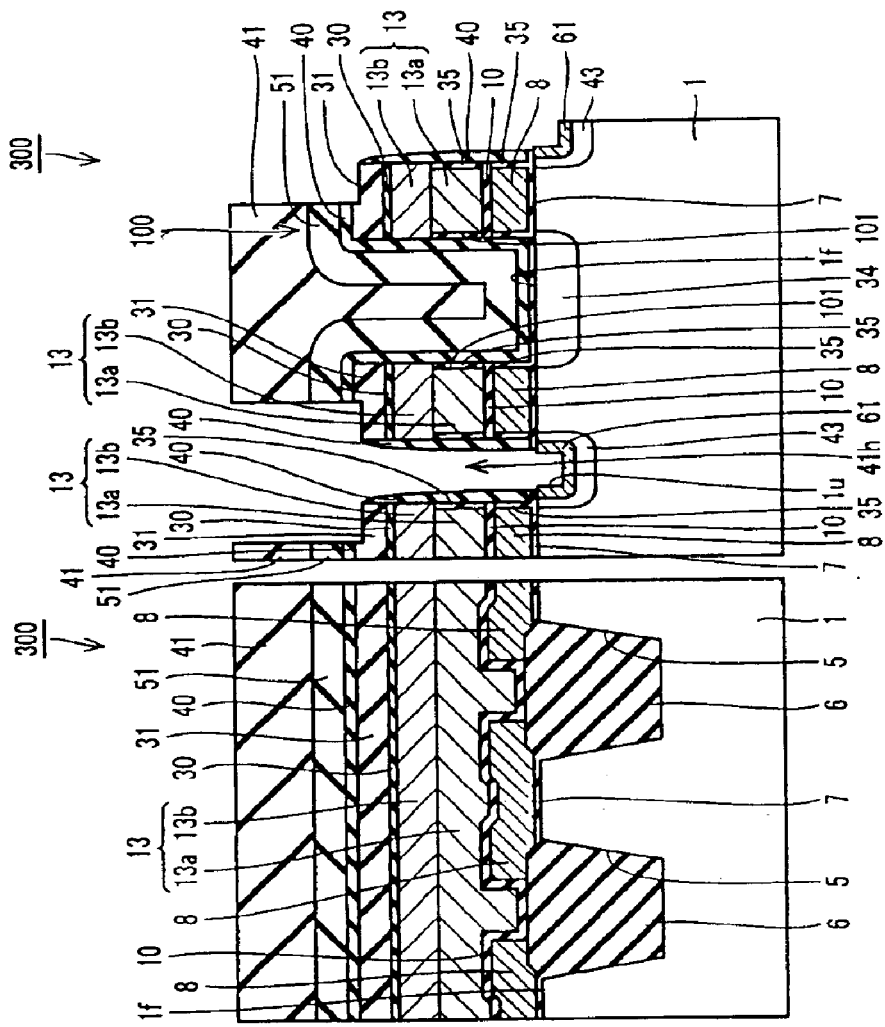
Figure 40:
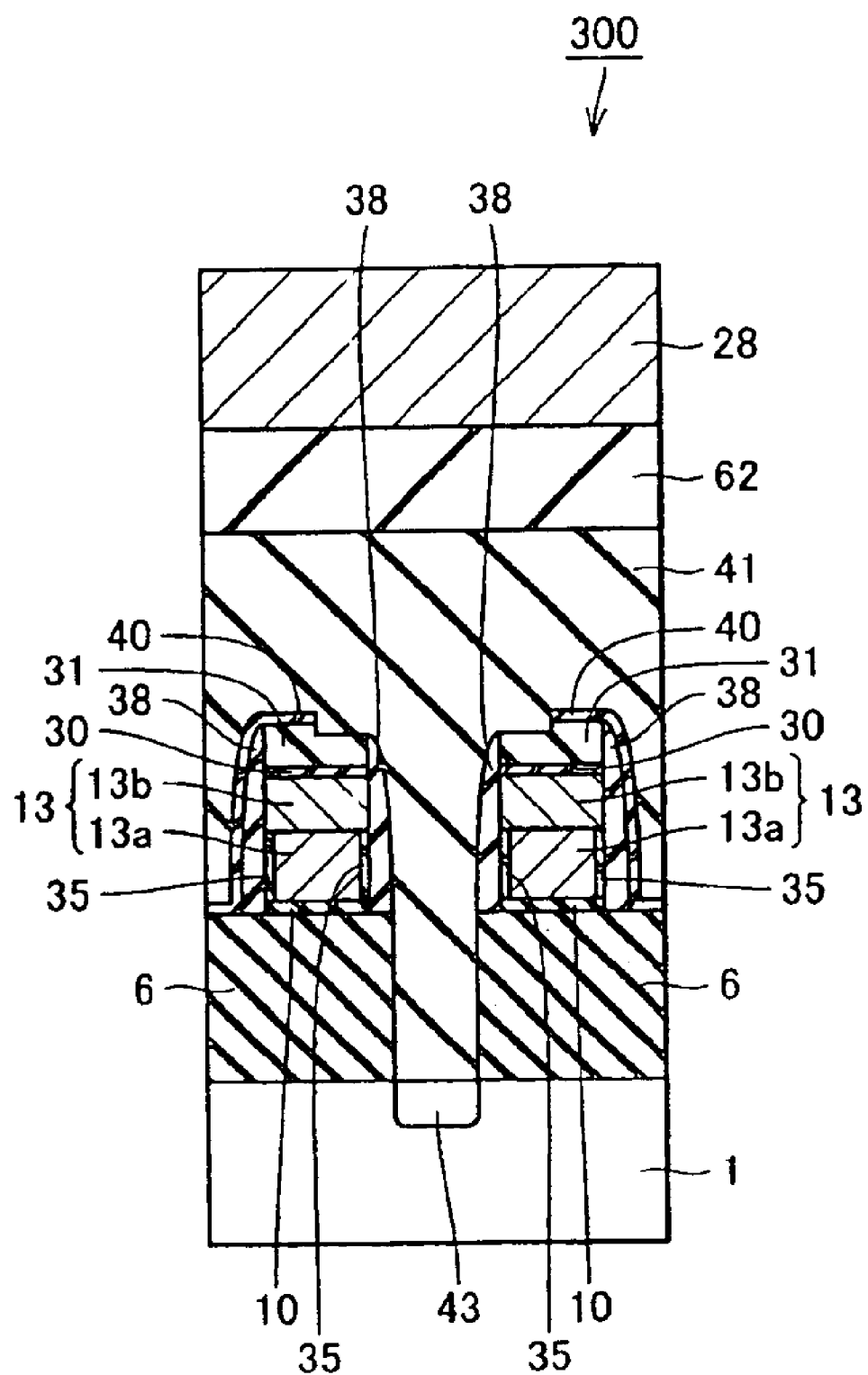
FIG. 40 is a cross sectional view corresponding to FIG. 3, of the nonvolatile semiconductor memory device in accordance with the third embodiment of the present invention.
Figure 41:
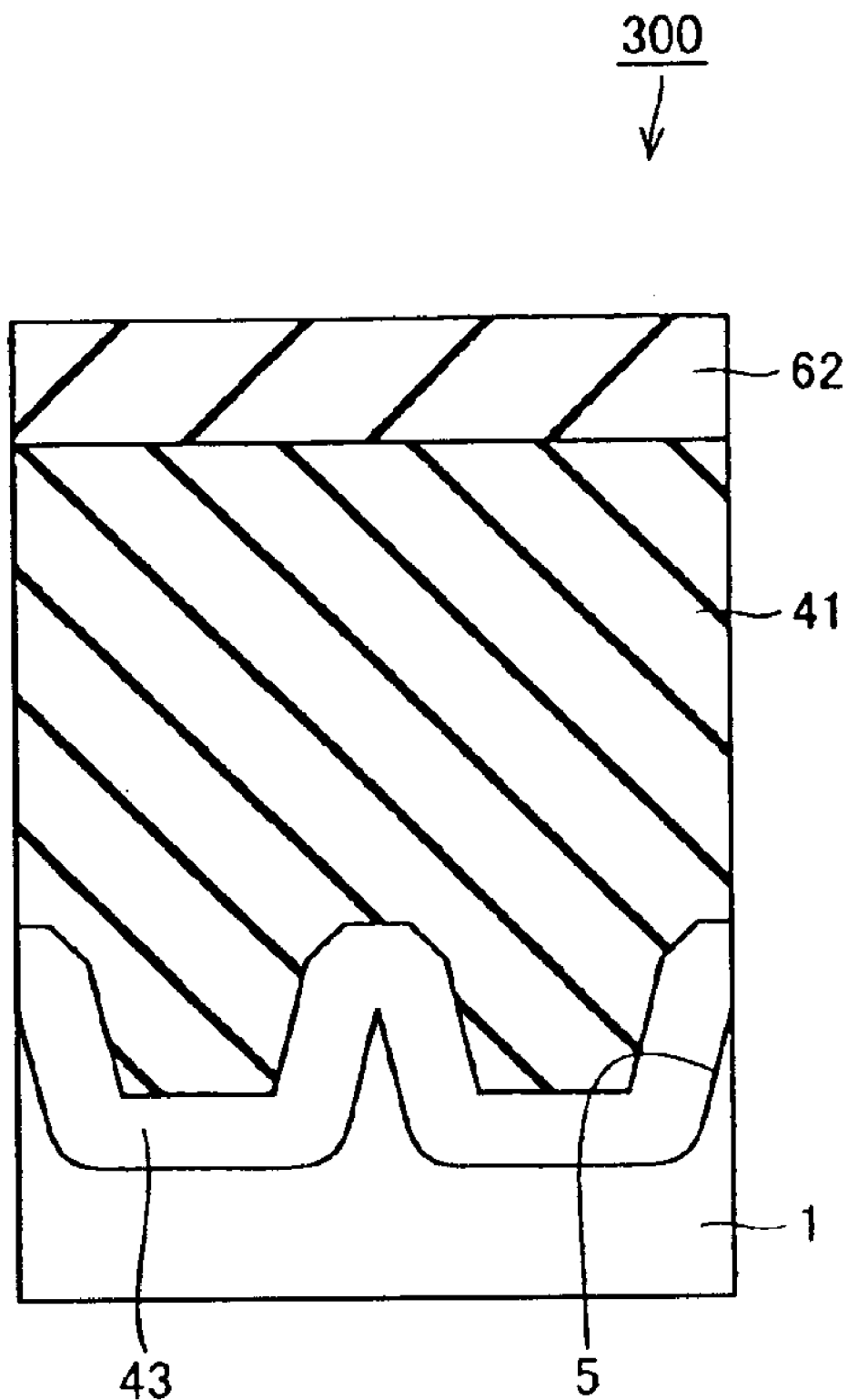
FIG. 41 is a cross sectional view corresponding to FIG. 4, of the nonvolatile semiconductor memory device in accordance with the third embodiment of the present invention.

Referring to FIGS. 38A to 38C, heat treatment for silicidation is performed. Thereafter, unreacted refractory metal layer 60 is removed. Since silicon is exposed only at the surface of source region 43 at this point of time, the surface of source region 43 serves as silicide region 61.

Referring to FIGS. 29A to 29C, the surface of source region 43 is covered by depositing silicon oxide film 62 of about 500 nm thick. Thereafter, a resist pattern is formed by applying a resist on silicon oxide film 62 and performing photolithography on the resist. Using the resist pattern as a mask, silicon oxide film 62 and interlayer insulating film 41 are etched to form contact hole 41a. Contact hole 41a reaches main surface 1f of silicon substrate 1. A doped polysilicon layer is formed to cover contact hole 41a, and the doped polysilicon layer is patterned to a prescribed shape to from interconnection layer 28. The nonvolatile semiconductor memory device shown in FIG. 29 is thereby finished.

Third Embodiment

Referring to FIGS. 39A to 41, the nonvolatile semiconductor memory device in accordance with a third embodiment of the present invention differs from the nonvolatile semiconductor memory device in accordance with the first embodiment in that a part of source region 43 is not metallized (silicidized). Since the surface of source region 43 is not metallized, source region 43 is directly in contact with silicon oxide film 62.

The method of manufacturing such a nonvolatile semiconductor memory device includes the steps excluding the steps shown in FIGS. 27A to 28C in the method of manufacturing a semiconductor device in the first embodiment. In other words, the nonvolatile semiconductor memory device shown in FIGS. 39A to 41 is finished by eliminating the steps of silicidation in FIGS. 27A to 28C.

This nonvolatile semiconductor memory device and the method of manufacturing thereof results in the similar effect as in the first embodiment, except that there is no effect resulting from silicidizing source region 43.

Fourth Embodiment

Figure 42A:
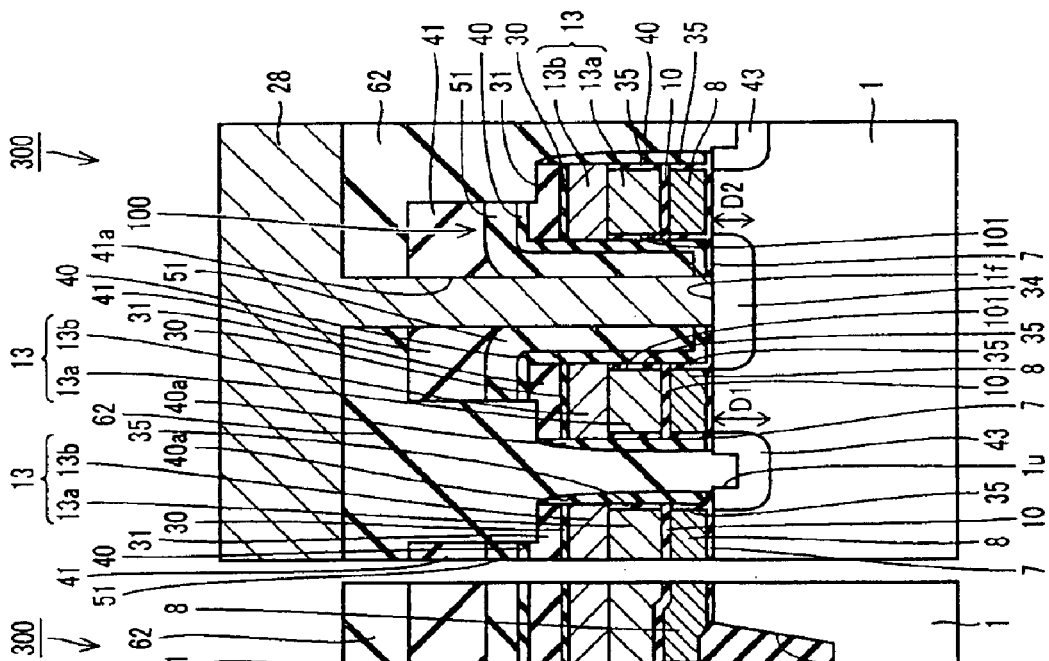
FIGS. 42A–42C are cross sectional views corresponding to FIGS. 2A–2C, of a nonvolatile semiconductor memory device in accordance with a fourth embodiment of the present invention.
Figure 42B:
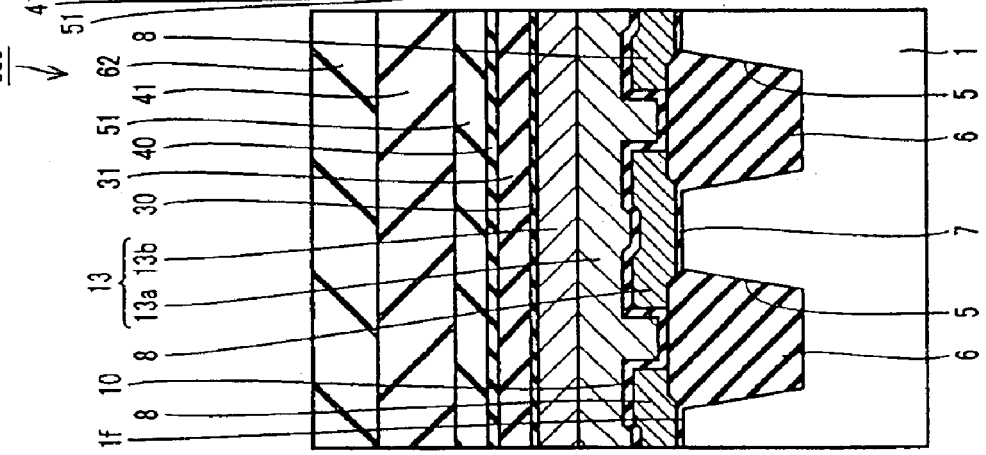
Figure 42C:
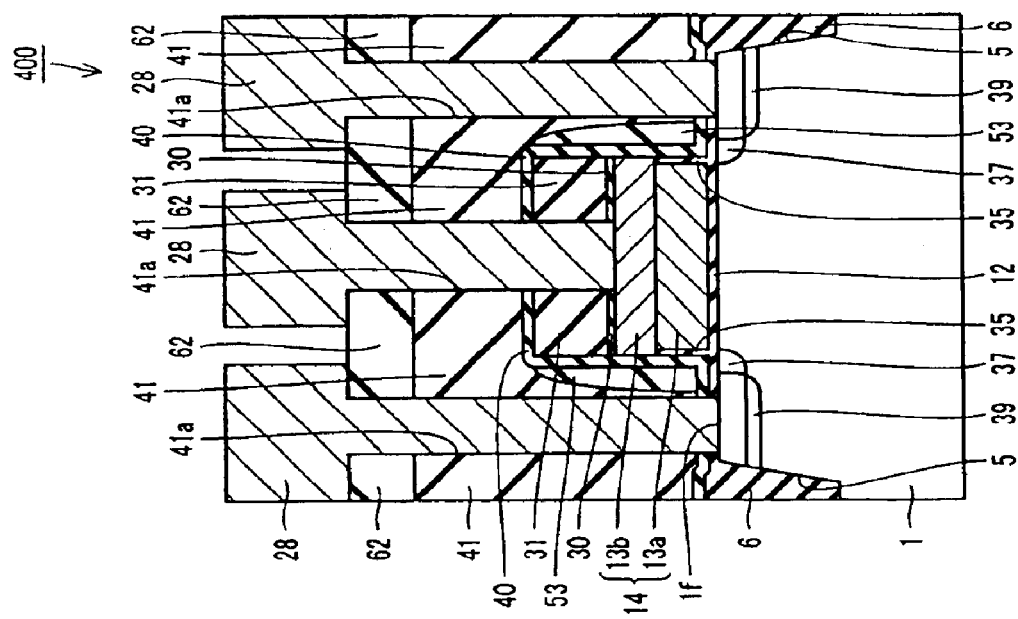

Referring to FIGS. 42A to 42C, the nonvolatile semiconductor memory device in accordance with a fourth embodiment of the present invention differs from the nonvolatile semiconductor memory device in accordance with the second embodiment in that a part of source region 43 is not metallized (silicidized).

The method of manufacturing such a nonvolatile semiconductor memory device includes the steps excluding the steps shown in FIGS. 37A to 38C in the method of manufacturing a semiconductor device in the second embodiment. In other words, the nonvolatile semiconductor memory device shown in FIGS. 42A to 42C is finished by eliminating the steps of silicidation in FIGS. 37A to 38C.

This nonvolatile semiconductor memory device and the method of manufacturing thereof results in the similar effect as in the second embodiment, except that there is no effect resulting from silicidation of source region 43.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nonvolatile semiconductor memory device comprising the steps of:

forming a plurality of stacked structures on a main surface of a semiconductor substrate, each of said stacked structures including a side surface and having a plurality of floating gate electrodes and a control gate electrode formed on a plurality of floating gate electrodes to extend in a prescribed direction;

forming an interlayer insulating film covering said stacked structure and having a top surface approximately parallel to said main surface;

forming a mask layer on the top surface of said interlayer insulating film;

forming an opening in the interlayer insulating film to be positioned between said stacked structures adjacent to each other by selectively etching said interlayer insulating film using said mask layer as a mask; and forming a source region extending along a plurality of floating gate electrodes by implanting impurity ions from said opening to said main surface.

2. The method of manufacturing a nonvolatile semiconductor memory device according to claim 1, further comprising the step of metallizing a part of said source region.

3. The method of manufacturing a nonvolatile semiconductor memory device according to claim 1, further comprising the steps of: forming an insulating film covering the side surfaces of said plurality of stacked structures and the main surface of said semiconductor substrate after forming said stacked structure and before forming said interlayer insulating film; and etching back said insulating film and leaving said insulating film covering the side surface of said stacked structure, to form a sidewall insulating film.

4. A method of manufacturing a nonvolatile semiconductor memory device comprising the steps of:

forming a plurality of stacked structures on a main surface of a semiconductor substrate, each of said stacked structures including a side surface and having a plurality of floating gate electrodes and a control gate electrode formed on a plurality of floating gate electrodes to extend in a prescribed direction;

forming an insulating film covering said stacked structure;

forming a sidewall insulating film covering said side surfaces of a plurality of stacked structures by etching back said insulating film; and forming a source region extending along said plurality of floating gate electrodes, between said plurality of stacked structures in said semiconductor substrate, by implanting an impurity in said semiconductor substrate using said sidewall insulating film as a mask.

5. The method of manufacturing a nonvolatile semiconductor memory device according to claim 4, further comprising the step of forming a plurality of isolation insulating films in said semiconductor substrate, wherein a part of said source region is formed between said plurality of isolation insulating films.

6. The method of manufacturing a nonvolatile semiconductor memory device according to claim 4, wherein said isolation insulating film includes an oxide film and said sidewall insulating film includes a nitride film.

7. The method of manufacturing a nonvolatile semiconductor memory device according to claim 4, further comprising the step of metallizing a part of said source region using said sidewall insulating film as a mask.

* * * * *